United States Patent
Ieizumi et al.

(10) Patent No.: US 8,079,137 B2
(45) Date of Patent: Dec. 20, 2011

(54) MOUNTING APPARATUS FOR ELECTRONIC COMPONENTS

(75) Inventors: Kazuyoshi Ieizumi, Ota (JP); Seiji Oonishi, Ota (JP); Koiti Izuhara, Oizumi (JP); Hisayoshi Kashitani, Ota (JP)

(73) Assignee: Hitachi High-Tech Instruments Co., Ltd., Saitama (JP)

( * ) Notice: Subject to any disclaimer, the term of this patent is extended or adjusted under 35 U.S.C. 154(b) by 451 days.

(21) Appl. No.: 12/409,545

(22) Filed: Mar. 24, 2009

(65) Prior Publication Data

US 2009/0241326 A1 Oct. 1, 2009

(30) Foreign Application Priority Data

Mar. 25, 2008 (JP) ................................. 2008-078105

(51) Int. Cl.
*H05K 13/04* (2006.01)
(52) U.S. Cl. ........... 29/739; 29/743; 29/741; 414/752.1; 414/749.1; 901/40
(58) Field of Classification Search ............ 29/739–743, 29/832–834, 836; 414/749.1, 752.1; 901/40
See application file for complete search history.

(56) References Cited

U.S. PATENT DOCUMENTS

| | | | | |
|---|---|---|---|---|
| 5,203,061 A * | 4/1993 | Hamada | .................. | 29/33 M |
| 6,681,468 B1 * | 1/2004 | Uchiyama et al. | ......... | 29/407.01 |
| 6,789,310 B1 * | 9/2004 | Hata et al. | ..................... | 29/740 |
| 6,860,002 B2 * | 3/2005 | Oyama | .......................... | 29/740 |
| 6,968,610 B2 * | 11/2005 | Nagao et al. | .................... | 29/740 |
| 6,986,195 B2 * | 1/2006 | Seto et al. | ....................... | 29/740 |
| 7,581,310 B2 * | 9/2009 | Fukushima et al. | ........... | 29/743 |
| 7,841,073 B2 * | 11/2010 | Mitsumochi et al. | .......... | 29/743 |
| 7,966,718 B2 * | 6/2011 | Kodama et al. | ................. | 29/739 |
| 2002/0184755 A1 * | 12/2002 | Suhara | ............................. | 29/833 |
| 2003/0135991 A1 * | 7/2003 | Nagao et al. | .................... | 29/739 |
| 2005/0274004 A1 * | 12/2005 | Yoshii et al. | .................... | 29/743 |
| 2007/0011869 A1 * | 1/2007 | Watanabe et al. | ............... | 29/739 |
| 2008/0263857 A1 * | 10/2008 | Mitsumochi et al. | .......... | 29/743 |
| 2010/0050426 A1 * | 3/2010 | Shimizu et al. | ................. | 29/739 |
| 2011/0030203 A1 * | 2/2011 | Mitsumochi et al. | .......... | 29/739 |

FOREIGN PATENT DOCUMENTS

| | | |
|---|---|---|
| EP | 0 808 091 | 11/1997 |
| JP | 2004-047818 | 2/2004 |
| JP | 2006-286707 | 10/2006 |
| WO | WO 2007/021026 | 2/2007 |

* cited by examiner

*Primary Examiner* — Derris Banks
*Assistant Examiner* — Kaying Kue
(74) *Attorney, Agent, or Firm* — Antonelli, Terry, Stout & Kraus, LLP.

(57) ABSTRACT

An electronic component is mounted on a printed board by a first head and a second head collaboratively. The first head is prioritized to the second head for moving operations. The range which allows the second head to move is defined in consideration with all the positions where the electronic components held by the first head are to be mounted on the printed board such that no collision occurs between the first head in operation and the second head.

9 Claims, 16 Drawing Sheets

FIG. 15

| NO. | U | O | P | BEAM | NOZZLE | Fdr NO. | COMPONENT ID |
|---|---|---|---|---|---|---|---|
| 12 | 00 | 0000 | 00000 | 1 | 00 | | |
| 13 | 01 | 0002 | 00138 | – | 07 | 131 | BCML811035Z |
| 14 | 01 | 0002 | 00137 | – | 06 | 131 | BCML811035Z |
| 15 | 01 | 0002 | 00143 | – | 11 | 131 | BCML811035Z |
| 16 | 01 | 0002 | 00139 | – | 04 | 131 | BCML811035Z |
| 17 | 01 | 0002 | 00140 | – | 03 | 131 | BCML811035Z |
| 18 | 01 | 0002 | 00142 | – | 02 | 131 | BCML811035Z |
| 19 | 01 | 0002 | 00141 | – | 01 | 131 | BCML811035Z |
| 20 | 01 | 0002 | 00144 | – | 05 | 131 | BCML811035Z |
| 21 | 01 | 0001 | 00138 | – | 08 | 131 | BCML811035Z |
| 22 | 01 | 0001 | 00137 | – | 09 | 131 | BCML811035Z |
| 23 | 01 | 0001 | 00143 | – | 10 | 131 | BCML811035Z |
| 24 | 01 | 0001 | 00139 | – | 12 | 131 | BCML811035Z |
| 25 | 00 | 0000 | 00000 | 2 | 00 | | |
| 26 | 01 | 0002 | 00068 | – | 10 | 220 | BRFC164744Z |
| 27 | 01 | 0002 | 00189 | – | 04 | 230 | BDEY3770003 |
| 28 | 01 | 0002 | 00071 | – | 09 | 220 | BRFC164744Z |
| 29 | 01 | 0002 | 00069 | – | 08 | 220 | BRFC164744Z |
| 30 | 01 | 0002 | 00070 | – | 07 | 220 | BRFC164744Z |
| 31 | 01 | 0001 | 00188 | – | 01 | 229 | BDEY3623003 |
| 32 | 01 | 0001 | 00067 | – | 05 | 220 | BRFC164744Z |
| 33 | 01 | 0001 | 00072 | – | 06 | 220 | BRFC164744Z |
| 34 | 01 | 0001 | 00071 | – | 12 | 220 | BRFC164744Z |
| 35 | 01 | 0001 | 00182 | – | 03 | 218 | BDBC3052106 |
| 36 | 01 | 0001 | 00181 | – | 02 | 218 | BDBC3052106 |
| 37 | 01 | 0001 | 00068 | – | 11 | 220 | BRFC164744Z |
| 38 | 00 | 0000 | 00000 | 1 | 00 | | |
| 39 | 01 | 0002 | 00064 | – | 06 | 132 | BRFC162224Z |
| 40 | 01 | 0002 | 00063 | – | 05 | 132 | BRFC162224Z |
| 41 | 01 | 0002 | 00061 | – | 04 | 132 | BRFC162224Z |
| 42 | 01 | 0002 | 00062 | – | 03 | 132 | BRFC162224Z |
| 43 | 01 | 0002 | 00065 | – | 02 | 132 | BRFC162224Z |
| 44 | 01 | 0002 | 00114 | – | 11 | 120 | BRFC163914Z |
| 45 | 01 | 0002 | 00066 | – | 01 | 132 | BRFC162224Z |
| 46 | 01 | 0001 | 00114 | – | 12 | 120 | BRFC163914Z |

MOUNTING APPARATUS FOR ELECTRONIC COMPONENTS

CLAIM OF PRIORITY

The present application claims priority from Japanese Patent Application JP 2008-078105 filed on Mar. 25, 2008, the content of which is hereby incorporated by reference into this application.

BACKGROUND OF THE INVENTION

1. Field of the Invention

The present invention relates to a mounting apparatus for electronic components for mounting an electronic component taken out from an electronic component supply device on a printed board.

2. Description of the Related Art

Electronic devices have been multi-functionalized, and the number of required electronic components has been increasing. Those electronic components are mounted on the printed board, which will be incorporated in the electronic device. Accordingly, the cost of the electronic device directly reflects the number and type of the electronic components which can be mounted on the printed board per unit time.

JP-A No. 2006-286707 (Patent Document 1) discloses the apparatus for mounting the electronic component attracted by the mount head with plural nozzles to be taken out from the component supply device on the printed board. The mount head is installed in a moveable member attached to a beam which extends in an x-direction (hereinafter referred to as "x-beam") so as to be moved in the x-direction. The x-beam is installed in a moveable member attached to a beam which extends in a y-direction (hereinafter referred to as "y-beam") so as to be moved in the y-direction. The respective moveable members are moved to a desired position by a linear motor or a pulse motor in response to a command from a host computer such that the component is attracted or mounted.

In Patent Document 1 as described above, the component supply devices are disposed at both sides of the printed board, and the component mount heads are disposed at both sides of the printed board correspondingly to accelerate the rate for mounting the components. The frequently used components are distributed in the component supply units for the purpose of preventing efficiency deterioration caused by the frequent use of the specific components.

JP-A No. 2004-47818 (Patent Document 2) discloses the structure in which the plural heads are installed in the x-beam to accelerate the rates for taking out the electronic components from the electronic component supply device and for mounting the thus taken out components on the printed board.

In the structure disclosed in Patent Document 1, the frequently used components are distributed in the component supply device so as to shorten the total time for mounting. In this case, each of the mount heads disposed at both sides of the printed board is operated to mount the electronic component on the printed board at one side. In other words, the mount head takes out the electronic component from the component supply device at one side of the mounting apparatus for electronic components and mounts the electronic component only on one-side of the printed board. Two oppositely arranged mount heads are operated to mount the electronic components on the entire surface of the printed board.

As each of those two mount heads mounts the component only on one side of the printed board, no collision occurs therebetween. In this case, however, the mount head mounts the electronic component only on one side of the printed board taken from the component supply device at one side, which may limit the freedom degree. Each of the two mount heads may be structured to pick up the component from the component supply devices at both sides to mount the electronic component on the other side of the printed board. In the aforementioned case, the two mount heads interfere with each other to have the risk of collision.

The mount head is structured to move at a high speed of approximately 2 m/sec for accelerating the rate for mounting the component. Collision of those mount heads which are moving at high speeds may break themselves. Additionally, as the mount head is provided with many nozzles for attracting the components, the mechanism for controlling those nozzles, and the camera for identifying the substrate, breakage of those components due to the collision may cause serious damage. The mounting apparatus for electronic components cannot be operated until recovery of the damaged head, which may seriously deteriorate the productivity.

In the structure disclosed in Patent Document 2, the component supply device is disposed only at one side of the printed board, and the plural heads are installed in the x-beam to accelerate the rate for mounting the component. However, it is difficult for the aforementioned structure to provide sufficient space for the component supply. The structure may also cause the risk of collision among the plural heads installed in the x-beam. The risk of head collision may occur especially in the maintenance process to cause the problem likewise Patent Document 1.

SUMMARY OF THE INVENTION

The present invention provides a mounting apparatus for electronic components which allows two mount heads to pick up an electronic component from two component supply devices, respectively and to mount the electronic components on the overlapped region of the printed board while preventing collision between those two mount heads.

Specifically, the present invention is realized by the following features.

(1) The present invention provides a mounting apparatus for electronic components which includes a conveying device for conveying a printed board in a first direction, and a first component supply device and a second component supply device at both outer sides of the conveying device in a second direction perpendicular to the first direction. A first y-beam and a second y-beam each extending in the second direction are provided apart from each other, and a first x-beam and a second x-beam each extending in the first direction are provided across the first and the second y-beams. The first x-beam is provided with a first mount head, and the second x-beam is provided with a second mount head. The first mount head takes out plural electronic components from the first component supply device, and mounts the electronic components at plural positions on the printed board, and the second mount head takes out plural electronic components from the second component supply device, and mounts the electronic components at plural positions on the printed board. A movement of the first mount head is prioritized to a movement of the second mount head. The movement of the second mount head is determined in consideration with each mount position on the printed board from the mount position where the electronic component is mounted by the first mount head on the printed board until the end of mount operations of all the electronic components held by the first mount head.

(2) In the aforementioned structure, when an extending direction of the x-beam is set as an x-direction, and an extending direction of the y-beam is set as a y-direction, a range which allows the second mount head to move changes step functionally from the position at which the second mount head opposes the first mount head in the y-direction to the position at which the second mount head overlaps with the first mount head in the y-direction.

(3) In the aforementioned structure, the position which step functionally changes from the position at which the second mount head opposes the first mount head in the y-direction to the position at which the second mount head overlaps with the first mount head in the y-direction is determined by a maximum x-coordinate and a minimum x-coordinate at each mount position on the printed board from the position at which the mount operation is currently performed by the first mount head until the end of the mount operations of all the electronic components held by the first mount head on the printed board.

(4) In the aforementioned structure, a step of the step function in the y-direction defines a range where no collision occurs between the first x-beam and the second mount head, and a range where no collision occurs between the second x-beam and the first mount head.

(5) The present invention provides a mounting apparatus for electronic components which includes a conveying device for conveying a printed board in a first direction, and a first component supply device and a second component supply device at both outer sides of the conveying device in a second direction perpendicular to the first direction. A first y-beam and a second y-beam each extending in the second direction are provided apart from each other, and a first x-beam and a second x-beam each extending in the first direction are provided across the first and the second y-beams. The first x-beam is provided with a first mount head, and the second x-beam is provided with a second mount head. The first mount head takes out plural electronic components from the first component supply device, and mounts the electronic components at plural positions on the printed board, and the second mount head takes out plural electronic components from the second component supply device, and mounts the electronic components at plural positions on the printed board. A movement of the first mount head is prioritized to a movement of the second mount head. A region which allows the second mount head to move includes a first boundary opposite the first mount head which currently mounts the electronic component on the printed board in the y-direction and a second boundary which overlaps with the first mount head in the y-direction, both of which change step functionally.

(6) In the aforementioned structure, the coordinate in the x-direction having the step function changing stepwise is defined by a maximum x-coordinate and a minimum x-coordinate at each mount position on the printed board from the position at which the mount operation is currently performed by the first mount head until the end of the mount operations of all the electronic components held by the first mount head on the printed board.

(7) In the aforementioned structure, a step of the step function in the y-direction defines a range where no collision occurs between the first x-beam and the second mount head, and a range where no collision occurs between the second x-beam and the first mount head.

(8) The present invention provides a mounting apparatus for electronic components which includes a conveying device for conveying a printed board in a first direction, and a first component supply device and a second component supply device at both outer sides of the conveying device in a second direction perpendicular to the first direction. A first y-beam and a second y-beam each extending in the second direction are provided apart from each other, a first x-beam extends from the first y-beam in the first direction, and a second x-beam extends from the second y-beam in a reverse direction of the first direction. The first x-beam is provided with a first mount head, and the second x-beam is provided with a second mount head. The first mount head takes out plural electronic components from the first component supply device, and mounts the electronic components at plural positions on the printed board, and the second mount head takes out plural electronic components from the second component supply device, and mounts the electronic components at plural positions on the printed board. A movement of the first mount head is prioritized to a movement of the second mount head. The movement of the second mount head is determined in consideration with each mount position on the printed board from the mount position where the electronic component is mounted by the first mount head on the printed board until the end of mount operations of all the electronic components held by the first mount head.

(9) The present invention provides a mounting apparatus for electronic components which includes a conveying device for conveying a printed board in a first direction, and a first component supply device and a second component supply device at both outer sides of the conveying device in a second direction perpendicular to the first direction. A first y-beam and a second y-beam each extending in the second direction are arranged apart from each other, a first x-beam extends from the first y-beam in the first direction, and a second x-beam extends from the second y-beam in a reverse direction of the first direction. The first x-beam is provided with a first mount head, and the second x-beam is provided with a second mount head. The first mount head takes out plural electronic components from the first component supply device, and mounts the electronic components at plural positions on the printed board, and the second mount head takes out plural electronic components from the second component supply device, and mounts the electronic components at plural positions on the printed board. A movement of the first mount head is prioritized to a movement of the second mount head. A region which allows the second mount head to move includes a first boundary opposite the first mount head which currently mounts the electronic component on the printed board in the y-direction and a second boundary which overlaps with the first mount head in the y-direction, both of which change step functionally.

According to the present invention, the first head is preferentially operated to mount the electronic component on the printed board PR, and the entry position of the second head is determined in consideration with all the positions to which the first head moves subsequently. As the entry position of the second head is determined in consideration with the failure of the electronic component held by the first head at the subsequent position, collision between the first and the second heads is prevented.

The range other than the expected one to which the first head moves subsequently allows the second head to enter the region of the first head, thus expanding the moveable range for the second head.

The present invention is capable of preventing collision between the two mount heads, and maximizing the moveable ranges of the two mount heads so as to accelerate the rate for mounting the electronic components on the printed board.

BRIEF DESCRIPTION OF THE DRAWINGS

FIG. 15 shows an exemplary program for mounting the electronic component on the printed board from the mount head;

FIG. 17 is a plan view of the generally employed mounting apparatus for electronic components showing that two mount heads mount the electronic components on the

DESCRIPTION OF THE PREFERRED EMBODIMENTS

Figure 1:
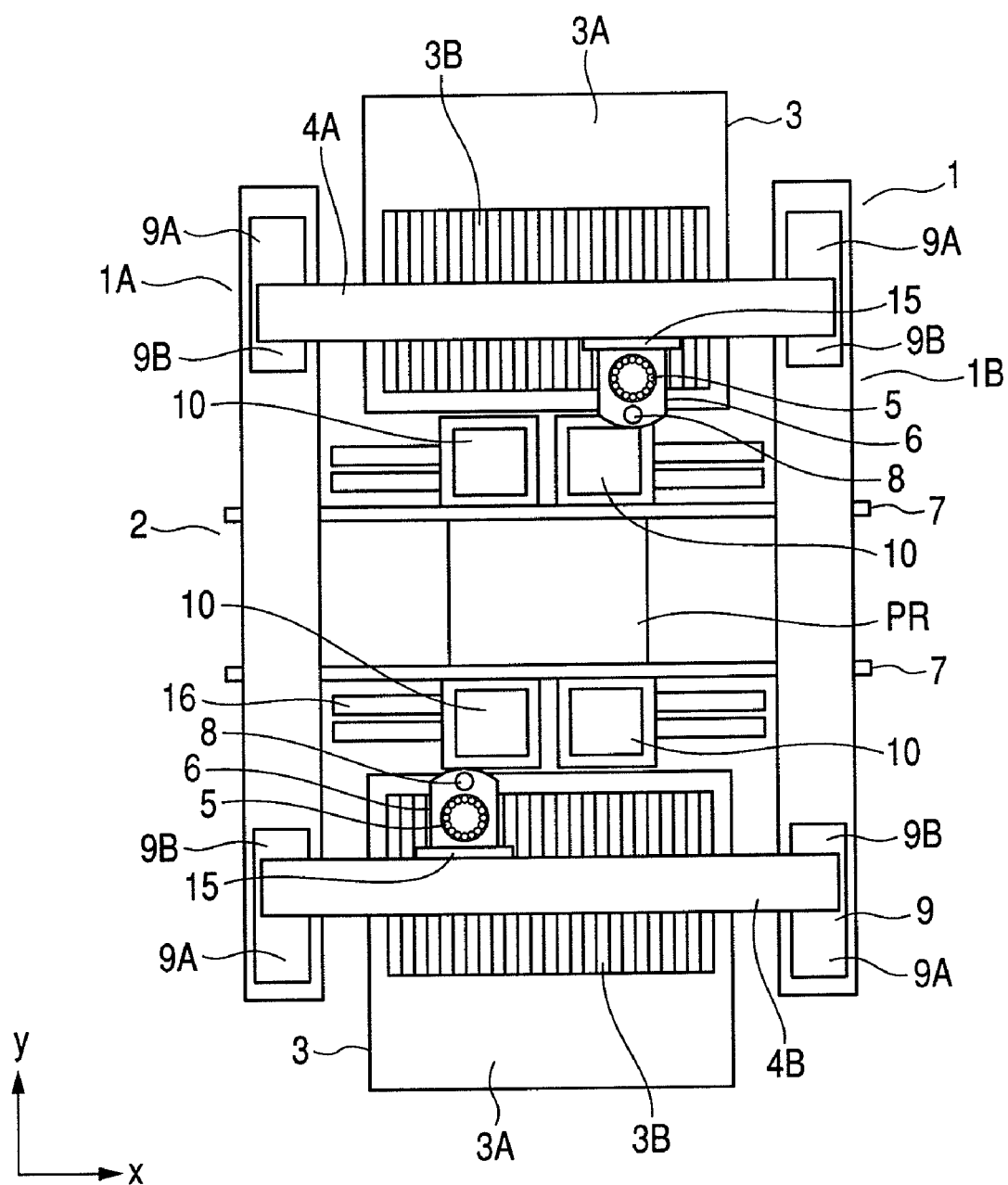
FIG. 1 is a plan view of a mounting apparatus for electronic components according to the present invention.

FIG. 1 is a plan view of a mounting apparatus 1 for electronic components according to the present invention. Referring to FIG. 1, a printed board PR on a rail type printed board conveyor 7 is conveyed from the left to the mounting apparatus 1 for electronic components, and positioned in the center thereof. A printed board conveying device 2 includes the printed board conveyor 7, a drive unit, and a positioning unit. When the operation for mounting the electronic component on the printed board PR is finished, the printed board PR is discharged to the right.

As the case may be, two or more mounting apparatuses 1 for electronic components as shown in FIG. 1 may be disposed in parallel to complete the mount operation of the electronic components on the printed board PR. In this case, half the components are mounted on the printed board PR by the first mounting apparatus for electronic components, and thereafter, the printed board PR on the printed board conveyor 7 is moved rightward in the drawing. Then the printed board PR is conveyed to the second mounting apparatus for electronic components at the downstream of the first mounting apparatus for the electronic components such that the rest of the electronic components are mounted likewise the first mounting apparatus for electronic components.

Referring to FIG. 1, component supply devices 3 are disposed at the upper and lower sides of the mounting apparatus 1 for electronic components. The component supply device 3 includes a feeder base 3A and a component supply unit 3B. The feeder base 3A is attached to the main body of the mounting apparatus 1 for electronic component. The component supply unit 3B is formed of plural tapes each provided with the electronic component. When the component disposed on the tape is taken out by an attracting nozzle 5 of the mount head 6, the tape is fed to be brought into the stand-by state to allow the next electronic component to be taken out.

The mounting apparatus 1 for electronic components is provided with y-beams 1A and 1B at both sides each extending in the y-direction. The left and right y-beams 1A and 1B have y-moveable members 9, respectively. Stators provided for the y-beams 1A and 1B, and the y-moveable members 9 constitute a linear motor. The linear motor allows the y-moveable member 9 to move freely in the y-direction on the y-beams 1A and 1B. Ends of the x-beams 4A and 4B each extending in the x-direction are attached to the left and right y-moveable members 9. The x-moveable members 15 are attached to the x-beams 4A and 4B. Stators installed in the x-beams 4A and 4B, and the x-moveable members 15 constitute the linear motor. The linear motor allows the x-moveable members 15 to freely move on the x-beams 4A and 4B. The mount head 6 is installed in the x-moveable member 15.

The y-moveable member 9 is driven by the linear motor to move on the y-beams 1A and 1B in response to the command from the host computer. The x-moveable member 15 is driven by the linear motor to move on the x-beams 4A and 4B in response to the command from the host computer. The y-moveable member 9 and the x-moveable member 15 are provided with linear encoders for performing the feedback of the position information of the respective moveable members to the servo system.

Figure 5:
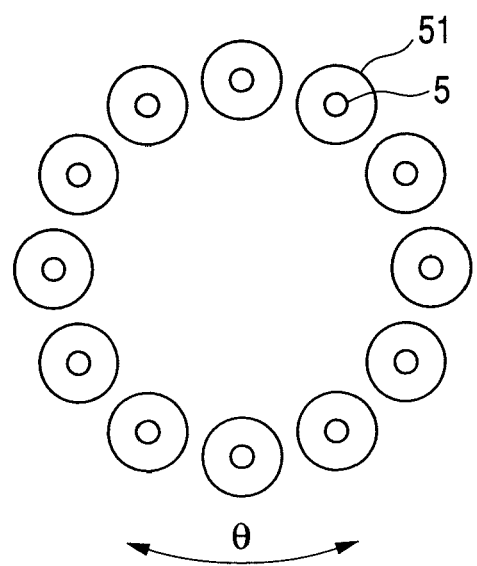
FIG. 5 is a view showing nozzles arranged in the mount head.

The mount head 6 is provided with attracting nozzles 5 for attracting the components which are circularly arranged. In the embodiment, 12 attracting nozzles 5 are circularly arranged as shown in FIG. 5. Those nozzles are rotated by a nozzle rotating motor 52 to attract the target electronic components, respectively.

A substrate identifying camera 8 is installed in the mount head 6 for identifying a reference point of the printed board PR when the mount head 6 moves above the substrate. Based on the reference point of the printed board PR, the position for mounting the electronic component on the printed board PR is determined. The aforementioned components of the mount head 6 are encased with a head cover 12. A bumper 11 (not shown in FIG. 1) which will be described later is provided outside the head cover 12.

FIG. 1 shows that two mount heads 6 attract the electronic components from the component supply unit 3B at the upper side and the component supply unit 3A at the lower side, respectively. In the aforementioned state, the mount head 6 rotates the nozzles to attract 12 components.

Component identifying cameras 10 are disposed between the component supply device 3 and the printed board PR. An image pickup portion of the component identifying camera 10 is disposed at the lower side of FIG. 1 for identifying the state of the electronic components attracted by the attracting nozzles 5. The component identifying camera 10 is capable of identifying states of the electronic components attracted by 12 nozzles 5 at a time. In the case where the electronic component in the abnormal attracted state is mounted on the printed board PR, the mount failure occurs. When the component identifying camera 10 detects the abnormal attracted state of the component, the subject component is dropped into a discard box 16. When the electronic component attracted by the mount head 6 is defective, it will be dropped into the discard box 16 as well. The discard box 16 is attached to the side of the component identifying camera 10. Two units of the component identifying cameras 10 are disposed at both sides of the printed board PR for the purpose of immediately identifying the attracted state of the electronic component.

Referring to FIG. 1, the y-moveable member 9 in a combined state may be separated into an inner moveable member 9B and an outer moveable member 9A. The inner moveable member 9B is shorter than the outer moveable member 9A in order to prevent the y-moveable member 9 from serving as the stopper when two mount heads 6 pick up the components from the same component supply device 3, or mount the electronic components on the overlapped regions of the printed board PR in the y-direction. However, as the y-moveable member 9 is prevented from serving as the stopper, the two mount heads 6 may have the risk of collision. The present invention makes it sure to prevent collision between those two mount heads.

Figure 16:
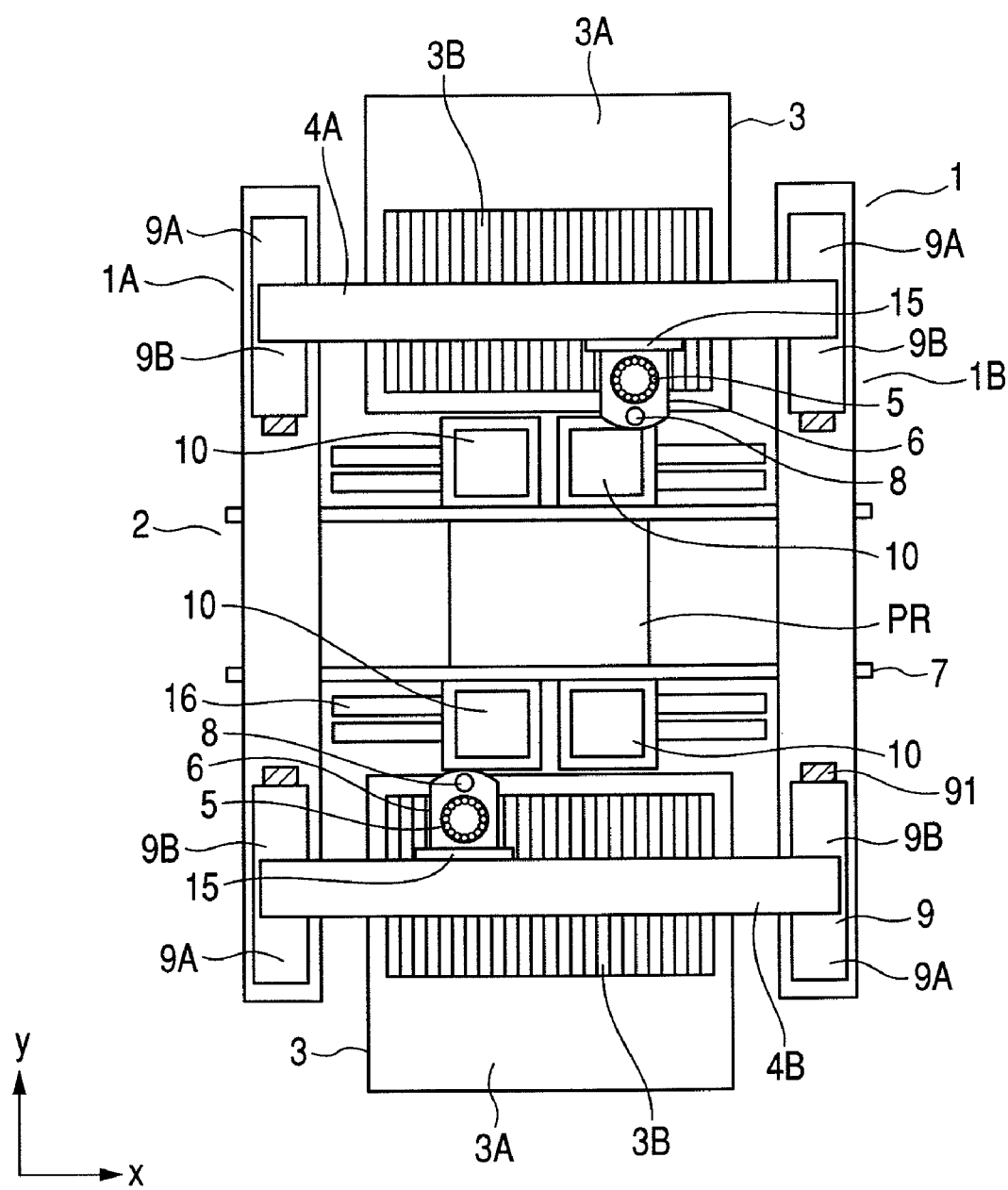
FIG. 16 is a plan view of the generally employed mounting apparatus for electronic components showing that two mount heads attract the electronic components from the component supply unit.

FIG. 16 is a plan view of a generally employed mounting apparatus 1 for electronic component. Unlike the present invention shown in FIG. 1, each of the outer moveable member 9A and the inner moveable member 9B of the y-moveable member 9 attached to the y-beams 1A and 1B has the substantially the same length. A stopper 91 is attached to the leading end of the inner moveable member 9B. The end of the stopper 91 is flush with or slightly protrudes from the leading end of the mount head 6. The stopper 91 serves to prevent collision between the upper and the lower mount heads 6. In the structure shown in FIG. 16, the stopper 91 prevents the mount head 6 at the lower side from attracting the electronic component from the component supply device 3 at the upper side of the drawing.

Figure 2:
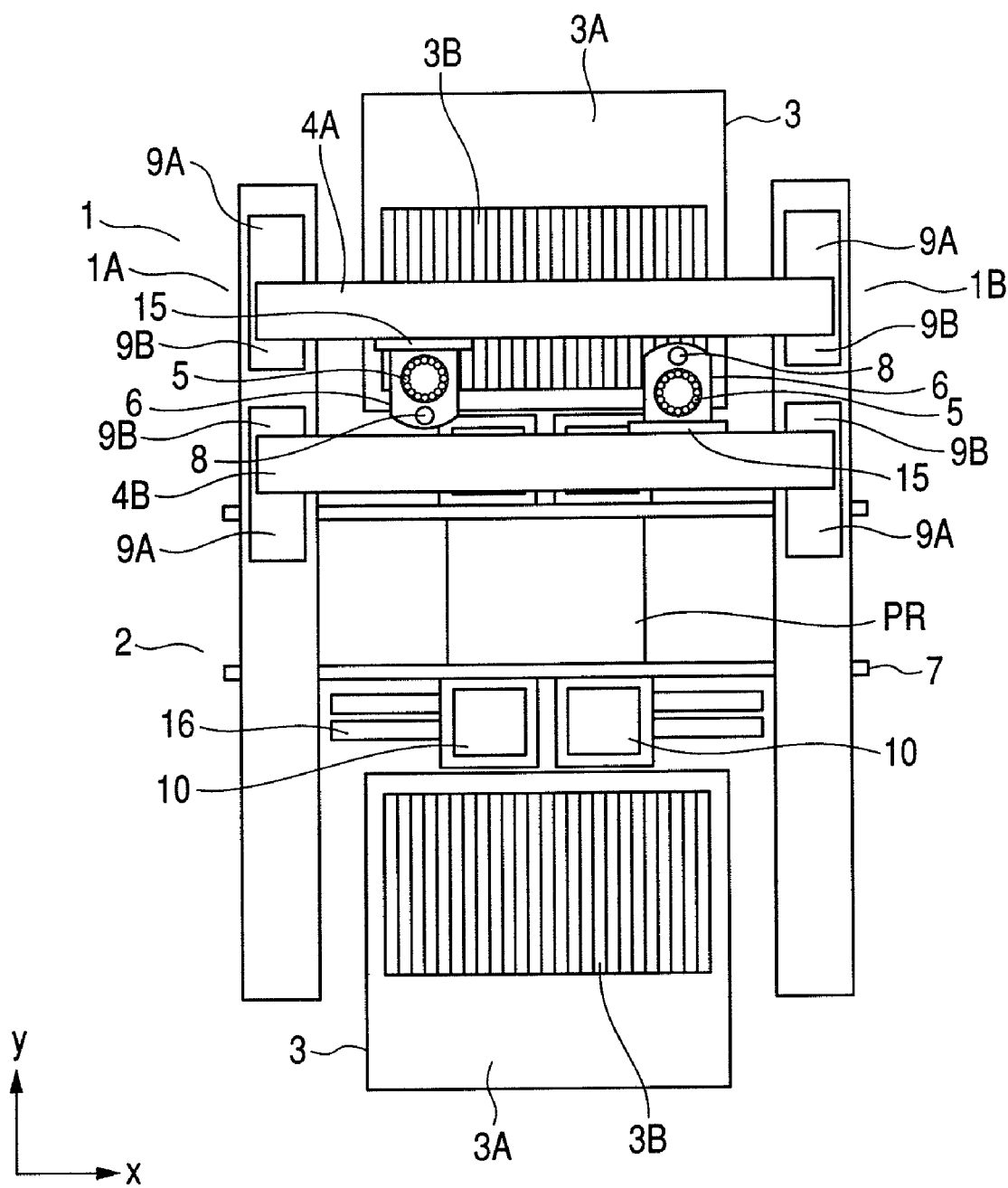
FIG. 2 is a plan view of the mounting apparatus for electronic components according to the present invention, showing that two mount heads attract the electronic components from the same component supply unit.

Referring to FIG. 2, in the mounting apparatus 1 for electronic components according to the present invention, the mount heads 6 take up the electronic components from the component supply unit 3B of the component supply device 3 at the upper side. The x-beam 4B at the lower side of the drawing attached to the y-moveable member 9 moves on the y-beams 1A and 1B to the position above the component supply unit 3B at the upper side of the drawing. Referring to FIG. 2, two mount heads 6 pick up the components from the component supply unit 3B at the upper side of the drawing. As described referring to FIG. 1, the inner moveable members 9B of the y-moveable members 9 which do not serve as the stoppers allow those two mount heads 6 to perform the interfering operation, resulting in increased freedom degree for mounting the electronic components. Meanwhile, referring to FIG. 2, the mount heads 6 are overlapped in the y-direction. If the mount heads 6 move in the x-direction in the aforementioned state, the two mount heads 6 may have the risk of collision.

Figure 3:
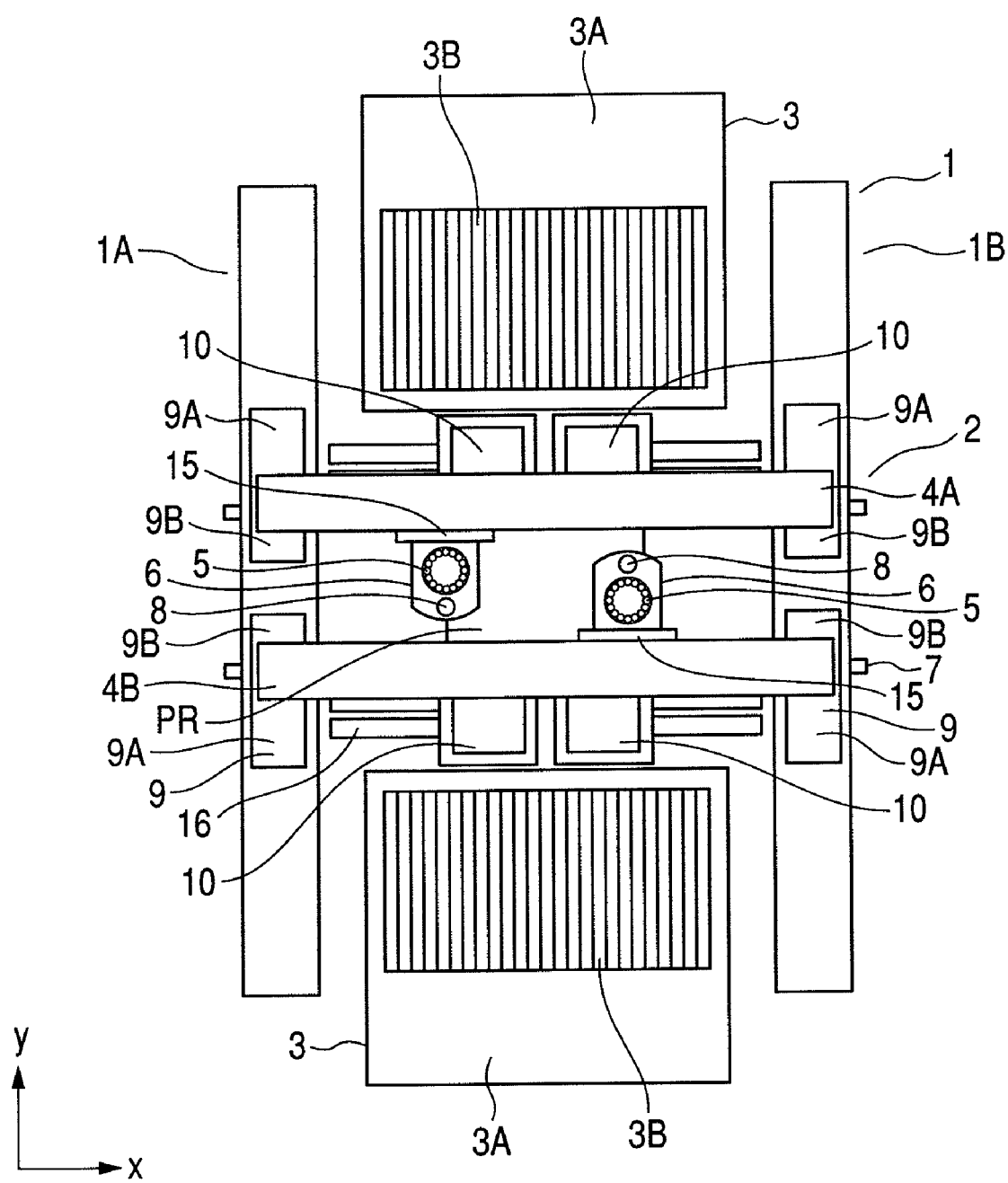
FIG. 3 is a plan view of the mounting apparatus for electronic components according to the present invention, showing that two mount heads mount the electronic components on the printed board.

FIG. 3 is a plan view showing the state where the two mount heads 6 attract the electronic components from the component supply unit 3B at the upper side of the drawing, and then mount them on the printed board PR. Referring to FIG. 3, the two mount heads are apart from each other in the x-direction, but overlapped in the y-direction. As the inner moveable members 9B of the y-moveable members 9 do not serve as the stoppers, the aforementioned positional relationship may be realized. In this way, the electronic components may be mounted on the overlapped regions of the printed board PR in the y-direction by the two heads, resulting in the increased freedom degree for the mount operation. The rate for mounting the electronic components on the printed board PR may be accelerated especially when more electronic components are mounted on one side of the printed board PR.

Figure 17:
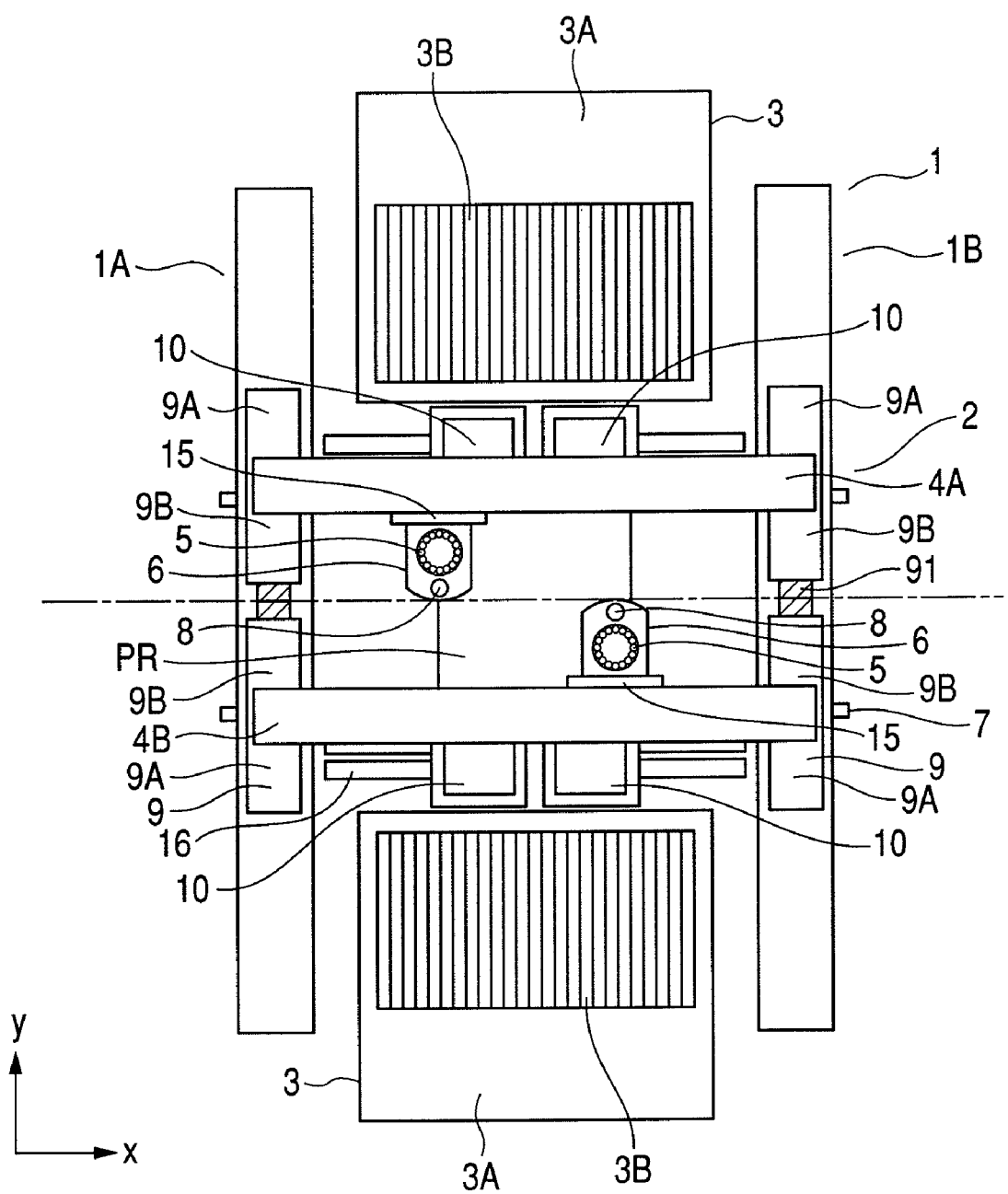

FIG. 17 is a plan view of the generally employed mounting apparatus 1 for electronic components having the electronic components mounted on the printed board PR. Referring to FIG. 17, both the mount heads 6 at the upper and the lower sides are operated to mount the electronic components on the printed board PR. In the drawing, the mount head 6 at the upper side mounts the electronic component only on the upper side of the printed board PR. The mount head 6 at the lower side mounts the electronic component only on the lower side of the printed board PR.

The apparatus shown in FIG. 17 has a structure which does not allow the mount head 6 at the upper side of the drawing to attract the electronic component from the component supply unit 3B at the lower side of the drawing. The apparatus shown in FIG. 17 is structured to be individually operated for the upper and the lower sides of the printed board PR. In other words, in the case where the number of the electronic components to be mounted on the upper side of the printed board PR is largely different from that of the electronic components to be mounted on the lower side of the printed board PR, even if the mount operation on one side of the printed board PR is finished, the head operation has to be in the stand-by state until the mounting operation for the other side of the printed board PR, that is, the operation for mounting larger number of the electronic components is finished, resulting in the operation time loss.

Meanwhile, in the structure of the apparatus shown in FIG. 17, the mount head 6 at the upper side is not allowed to enter the region below the center line of the printed board PR, and the mount head 6 at the lower side is not allowed to enter the region above the center line of the printed board PR. A stopper 91 is formed on the leading end of the inner moveable member 9B of the y-movable member 9. Accordingly, there is substantially no risk of collision between the heads at the upper and the lower sides.

As described above, although the mounting apparatus for electronic components to which the present invention is applied is capable of mounting the electronic components on the printed board at higher rates than the generally employed mounting apparatus for electronic components, there may be the risk of collision between the mount heads. The present invention provides the apparatus capable of avoiding the collision between the mount heads while keeping each moveable range of the respective heads as large as possible.

Referring to FIGS. 1, 2 and 3, the x-beams 4A and 4B are supported by two y-beams 1A and 1B. However, the x-beams 4A and 4B do not have to be supported by the two y-beams. The x-beams may be supported only by one of the y-beams if the strength of the x-beam permits. For example, the x-beam 4A may be supported only by the y-beam 1A, and the x-beam 4B may be supported only by the y-beam 1B.

Figure 4:
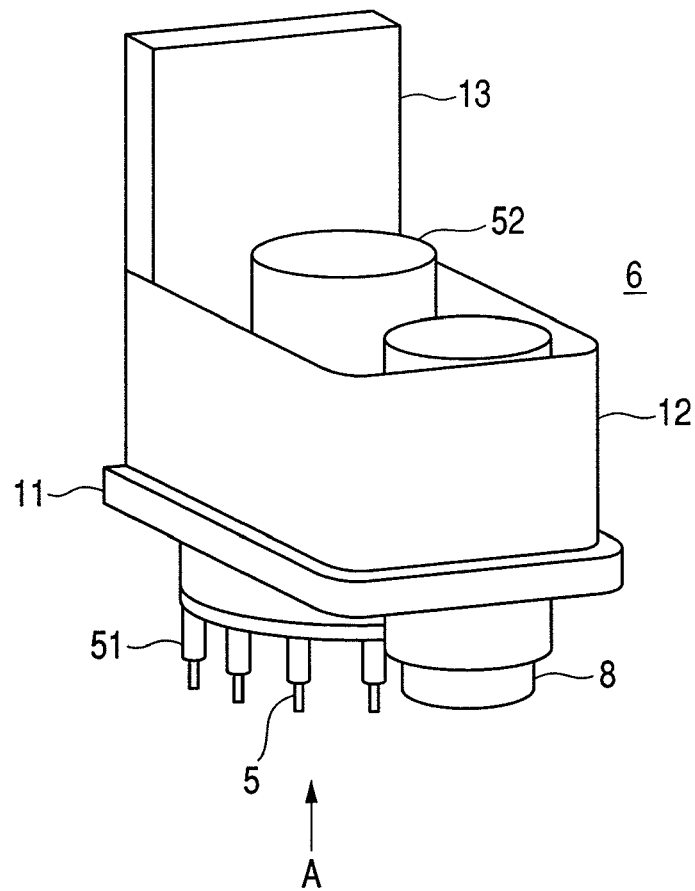
FIG. 4 is an external view of the mount head.

Referring to FIG. 4 which schematically shows the mount head 6, the attracting nozzles 5 for attracting the electronic components are circularly disposed at the lower side. Each of the attracting nozzles 5 has to be vacuumed to the negative pressure so as to attract the electronic component. For this, a cylinder 51 is provided for each of the attracting nozzles 5 for controlling the attraction.

FIG. 5 is a view of the attracting nozzle 5 seen from the direction A in FIG. 4. Referring to FIG. 5, 12 attracting nozzles 5 are circularly disposed. In the case where the electronic component is large, the circularly disposed attracting nozzles 5 are required to be large. Accordingly, the number of the disposed attracting nozzles 5 is reduced. The type of the attracting nozzle 5 has to be changed depending on the type of the printed board PR on which the electronic components are mounted.

The target electronic component is required to be attracted by the corresponding attracting nozzle 5. A nozzle rotary motor 52 rotates the attracting nozzle 5 as indicated by θ in FIG. 5 to place the corresponding attracting nozzle 5 above the target electronic component. Thereafter, the attracting nozzle 5 is moved down by the nozzle selection cylinder 51 such that the target electronic component is attracted. Upon attraction of the target electronic component, the attracting nozzle 5 is lifted up, and then the same operation is performed with respect to all the 12 attracting nozzles 5. The movement of the mount head 6 to the component supply unit 3B allows 12 components to be attracted at a time.

Referring to FIG. 4, the substrate identifying camera 8 is disposed to the front of the attracting nozzles 5 for detecting the reference position of the printed board PR when the mount head 6 moves above the printed board PR. Based on the reference position on the printed board PR, the mounting positions of the respective electronic components on the printed board PR are determined.

When the mount head 6 moves to the position corresponding to the printed board PR, the attracting nozzle 5 which holds the target electronic component is rotated to move above the corresponding position of the printed board PR. Thereafter, the attracting nozzles 5 are moved down to mount the target electronic component on the corresponding position of the printed board PR.

Referring to FIG. 4, the attracting nozzles 5, the nozzle selection cylinders 51, the substrate identifying camera 8 and other components are encased with the head cover 12. The head cover 12 simply for the covering purpose exhibits no effect for protecting the encased components against the external impact. In case of collision between the mount heads 6 each merely in the covered state, the drive mechanism of the attracting nozzle 5, and the substrate identifying camera 8 may be at risk of damage.

Referring to FIG. 4, the bumper 11 is disposed outside the head cover 12 to protect the encased attracting nozzle drive mechanism and the substrate identifying camera 8 upon collision between the head covers 12. The bumper 11 is required to exhibit the strength to a certain degree so as to perform the protecting function. Meanwhile, the mount head 6 is required to move at the high speed of approximately 2 m/sec. If the bumper 11 is too heavy, the mount head 6 cannot be moved at the high speeds. The configuration and the material of the bumper 11 are required to be determined in consideration with the aforementioned aspects. The bumper 11 of the embodiment is formed of the urethane resin.

Figure 6:
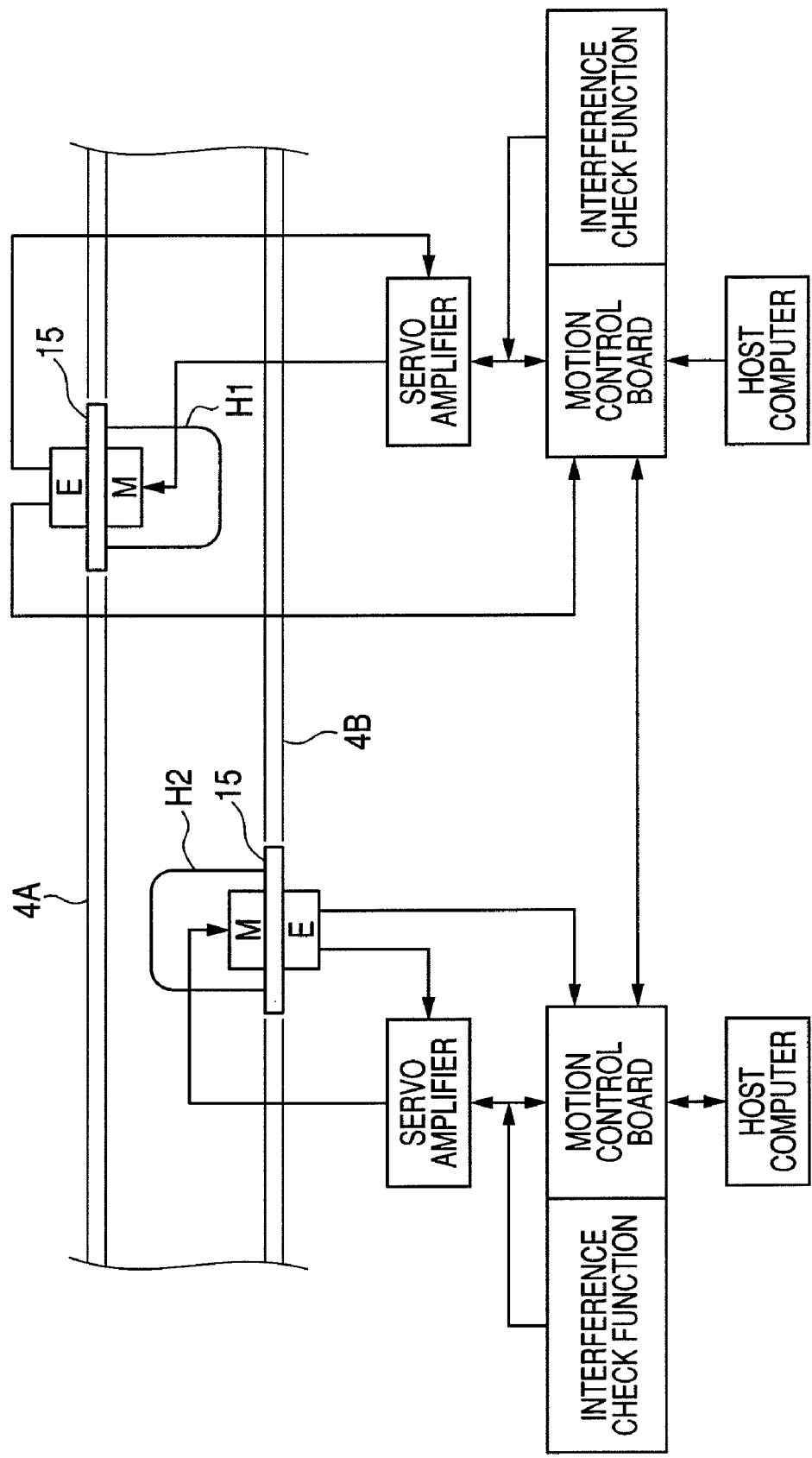
FIG. 6 schematically shows the control system of the mounting apparatus for electronic components according to the present invention.

FIG. 6 schematically shows the structure of the control system in the mounting apparatus for electronic components to which the present invention is applied. Two mount heads will be separately referred to as a first head H1 and a second head H2 for an explanatory purpose. Among two x-beams, the x-beam on which the first head is placed is referred to as a first x-beam 4A, and the x-beam on which the second head is placed is referred to as a second x-beam 4B, respectively.

Referring to FIG. 6, the first head H1 is attached to the first x-beam 4A via the x-moveable member 15. The x-moveable member 15 which forms a part of the linear motor M is provided with a linear encoder E. The linear motor M on the x-beam is used for moving the moveable member and the mount heads 6. The linear encoder E is used for detecting the position of the mount head 6. The second x-beam 4B is provided with the x-moveable member 15, the linear motor M, the linear encoder E, and the mount head 6 as well.

The y-moveable member 9 shown in FIG. 1 is provided with the linear motor M and the linear encoder E (not shown in the drawing). The linear motor M is used for moving the x-beam on the y-beam, and the linear encoder E is used for detecting the position of the x-beam on the y-beam. The linear encoder E will be referred to the one attached to the x-moveable member 15 and the one attached to the y-moveable member 9. The position information from the linear encoder E refers to the one derived from the linear encoder E attached to the x-moveable member 15 and the one derived from the linear encoder E attached to the y-moveable member 9.

Referring to FIG. 6, the operation of the second head H2 attached to the second x-beam 4B will be described. The command for moving the mount head 6 is sent from the host computer to the motion controller in accordance with the program installed therein. The host computer outputs the target position information of the mount head 6, the speed information for reaching the target position, and the acceleration information for accelerating to the set speed. The motion controller sends the received command to the servo amplifier. The servo amplifier sends the command to the linear motor M. The linear motor M moves the x-moveable member 15 and the mount head 6 to the predetermined position.

The linear encoder E attached to the x-moveable member 15 performs the feedback of the position information to the servo amplifier. The servo amplifier accurately sets the mount head 6 to the predetermined position. The operation of the second head H2 attached to the first x-beam 4A is performed in the same manner as described above.

Referring to FIG. 6, the feedback of the position information from the linear encoder E is sent not only to the servo amplifier but also to the motion controller. The motion controller shown in FIG. 6 sends the command from the host computer to the servo amplifier, and calculates the position, the speed and the acceleration of the mount head 6 based on the position information from the linear encoder E. The motion controller differentiates the position information from the linear encoder E to obtain the speed, and further differentiates the speed to obtain the acceleration.

The motion controller calculates the aforementioned information data for each movement of the mount head 6 to monitor the position, speed, and acceleration of the mount head 6. The motion controllers for controlling the second head H2 at the left side and the first head H1 at the right side are operated simultaneously. The motion controllers at the left and right sides shown in FIG. 6 constantly exchange and share the information data with respect to the position, speed and acceleration of the respective heads 6. The information exchange between the motion controllers is performed at the high speed of approximately 100 msec. The aforementioned position information exchange between the left and right motion controllers may be performed through wiring or electric coupling. Alternatively, the data exchange via the electric wave may be employed.

Figure 7:
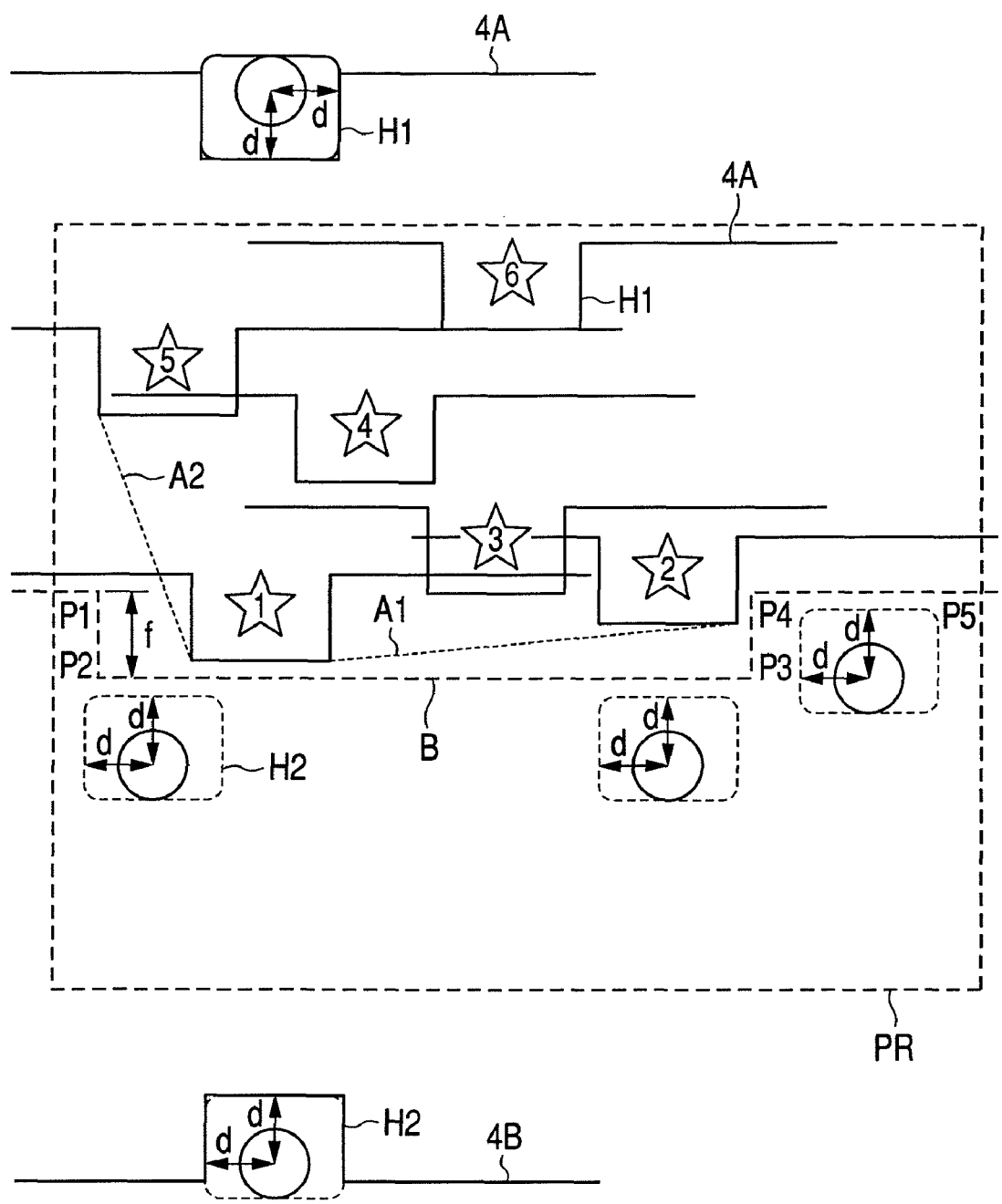
FIG. 7 schematically shows the range which allows the second head to move when the first head is located at the position 1.

FIGS. 7 to 14 schematically show the process for mounting the components according to the present invention. The first head H1 is placed on a home position of the first x-beam 4A at the upper side of FIG. 7. The second head H2 is placed on the home position of the second x-beam 4B at the lower side of the drawing. In FIG. 7, the first head H1 and the second head H2 move from the respective home positions so as to mount the electronic components on the printed board PR.

Figure 8:
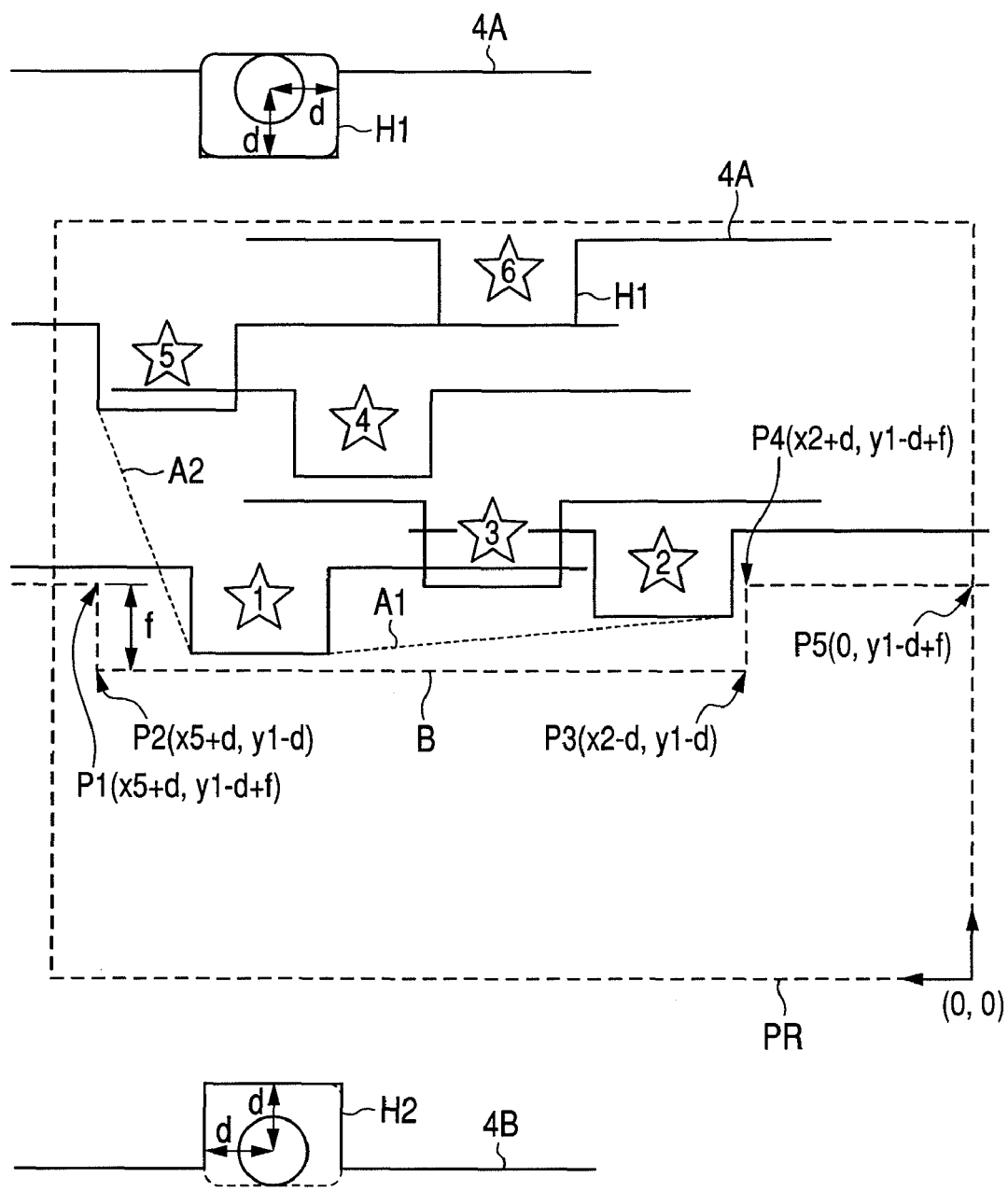
FIG. 8 is another view schematically showing the range which allows the second head to move when the first head is located at the position 1.

The exemplary outer dimension of the first head H1 is shown at the upper side of FIG. 7. Each distance d from the center of the first head H1 to the vertical side/lateral side is 87 mm, for example as the outer dimension of the mount head shown in FIG. 4 including the bumper. The outer dimension of the second head H2 as shown at the lower side of FIG. 8 is similar to the one as described above.

There may be the case where the x-beam and the mount head collide although no collision occurs between the heads. The x-beam is slightly retracted from the center of the mount head. The collision between the x-beam and the mount head occurs when the distance f between the mount head and the x-beam is larger than the distance d between the mount heads based on the center of the mount head. The value f may be set to 115 mm, for example.

As described referring to FIG. 4, the first head H1 allows 12 attracting nozzles to attract 12 electronic components. Those 12 electronic components are mounted on different positions of the printed board PR. Referring to FIG. 7, the first head H1 mounts the 12 components on 5 positions. That is, plural electronic components are mounted on the printed board PR at the single position. Each number in the stars of the 5 first heads H1 denotes the order for mounting the electronic components performed by the head.

Referring to FIG. 7, the first head H1 mounts the electronic component at a position 1, and further mounts the electronic component at a position 2. The electronic components are mounted sequentially to the position 6. The electronic components are mounted by two mount heads. The priority order between the first head H1 and the second head H2 is determined for avoiding the collision. In the embodiment, the first head H1 is prioritized such that the second head H2 is not allowed to enter the position at which the first head H1 mounts the electronic component.

Referring to FIG. 7, the component identifying camera shown in FIG. 1 detects whether or not the electronic component attracted by the first head H1 is defective, or whether or not the electronic component is appropriately attracted. Normally, the first head H1 moves from the position 1 to the position 2 to mount the electronic component. However, if the electronic component to be mounted at the position 2 is detected as the defective, the first head H1 skips the position 2 to move to the position 3. If the electronic component to be mounted at the position 3 is defective, the first head H1 moves from the position 1 to the position 4. If the component to be mounted at the position 4 is defective, the first head H1 moves to the position 5. If the component to be mounted at the position 5 is defective, the first head H1 moves to the position 6.

The first head H1 at the position 1 has a change to move to any one of the positions 2 to 6 depending on the state of the electronic component to be mounted. The defective electronic component to be attracted by the first head or the defective state of attracting the electronic component by the first head H1 cannot be preliminarily programmed.

Preferably the first head H1 and the second head H2 are positioned adjacent with each other for mounting the electronic components on the printed board PR at the rate as high as possible. As the first head H1 and the second head H2 become adjacent with each other, each operation range of the first head H1 and the second head H2 is extended. Normally the first head H1 is programmed to move from the position 1 to the position 2. In order to maximize the efficiency in the mount operation of the second head H2, the second head H2 is programmed to move to any position other than the position 2 of the first head H1. In this case, however, if the first head H1 moves from the position 1 to the position other than the position 2, it may be at risk of collision against the second head H2.

The present invention provides the mounting apparatus which maximizes each movement range of the first head H1 and the second head H2 while avoiding collision therebetween in consideration with the defective electronic component attracted by the first head H1. Referring to FIG. 7, the largest range which covers the movement of the first head H1 at the position 1 is the one defined by the dotted lines A1 and A2 shown in FIG. 7. The first head H1 and the second head H2 do not collide with each other unless the second head H2 enters the region defined by the dotted line B even if the electronic component attracted by the first head H1 is defective.

FIG. 8 shows the same arrangement as the one shown in FIG. 7 to represent specific coordinate of the range which allows the second head H2 to move. The dotted line B shown in FIG. 8 is the same as the dotted line B shown in FIG. 7, indicating the region which allows the second head H2 to move. FIG. 8 shows the range which allows the second head H2 to move as the coordinates. Specifically, the dotted line B showing the range which allows the second head H2 to exist does not represent the center of the second head H2 but the end position.

A zero point of the x-y coordinate is positioned at the lower right on the printed board PR shown in FIG. 8. When the first head H1 exists at the position 1, the second head H2 is not allowed to enter the region above the "y1−d" as the y-coordinate. In the aforementioned case, the "y1" denotes the y-coordinate at the center of the first head H1, and "d" denotes each distance from the center to the leading end of the first head H1/second head H2.

At the location apart from the first head H1, the second head H2 is allowed to enter the region above the y1−d. However, this may cause the collision against the first x-beam 4A for supporting the first head H1. Even at the location apart from the first head H1, it is not allowed to enter the region above the y-coordinate (y1−d+f) at P1 or P4. The code f denotes the distance from the center of the first head H1 to the opposite first x-beam 4A.

The range which allows the second head H2 to enter the point (y1−d+f) is defined by the position 5 of the first head H1. The position defined by the position 5 of the first head is expressed as (x5+d) as indicated by the x-coordinate at the points P1 and P2. The code "x5" denotes the x-coordinate of the position 5 of the first head H1, and "d" denotes the distance from the center to the leading end of the first head H1/second head H2 as shown by the upper or the lower side of FIG. 8.

The range which allows the second head H2 to enter up to the point (y1−d+f) at the right side of FIG. 8 is defined by the position 2 of the first head H1. The point defined by the position 2 of the first head H1 becomes (x2−d) as expressed by the x-coordinate at P3 and P4. The code "x2" denotes the x-coordinate of the position 2 of the first head H1, and code "d" denotes the distance from the center to the leading end of the first head H1/second head H2 as shown by the upper or the lower side of FIG. 8.

Referring to FIG. 7 or 8, when the range which allows the second head H2 to move is expressed by the x- and y-coordinates, y changes step functionally with respect to x. The coordinate at which the step function changes is defined by the points of the largest x-coordinate, and the smallest x-coordinate among those to which the first head H1 is expected to move.

The first head H1 and the second head H2 do not collide so far as the second head H2 moves within the region defined by the step function shown in FIGS. 7 and 8. Conversely, the second head H2 is allowed to enter the point (y1−d+f) as the y-coordinate other than the range from the P2 to P3 shown in FIG. 8. The freedom degree of the operation of the second head H2 is increased by the amount corresponding to the extended range, thus accelerating the rate for mounting the electronic components.

Figure 9:
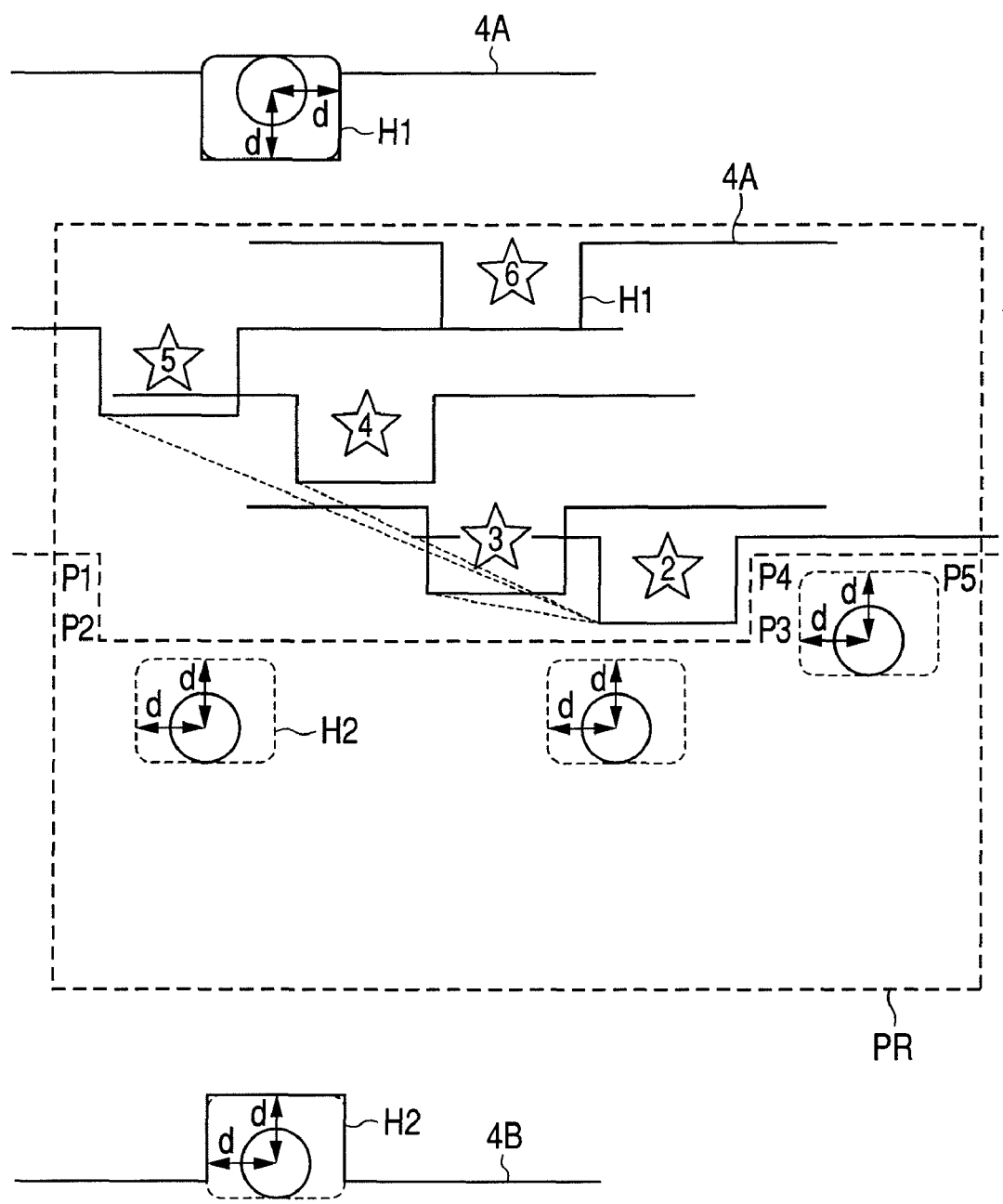
FIG. 9 is a view schematically showing the range which allows the second head to move when the first head is located at the position 2.

In FIG. 9, the first head H1 mounts the electronic component at the position 2 after finishing the mount operation of the electronic component at the position 1. The dotted line indicating the step function formed by connecting the P1, P2, P3, P4 and P5 denotes the range which allows the second head H2 to move. No collision occurs between the first head H1 and the second head H2 so far as the second head H2 moves within the defined range.

When the first head H1 finishes the mount operation of the electronic component at the position 2, the positions to which the first head is expected to move subsequently are the positions 3 to 6 in the order shown in the drawing. The position P5 locates to the leftmost position of the position 2. Accordingly, the x-coordinate at the point P1 or P2 is defined by the position 5.

Meanwhile, there is no position to which the first head H1 moves subsequently to the right of the position 2. The second head H2 is allowed to move to the x-coordinate at the point P3 or P4. The y-coordinate at P1, P4 and P5 may be defined for the purpose of avoiding the collision between the second head H2 and the first x-beam 4A with the first head H1, or between the first head H1 and the second x-beam 4B with the second head H2.

Figure 10:
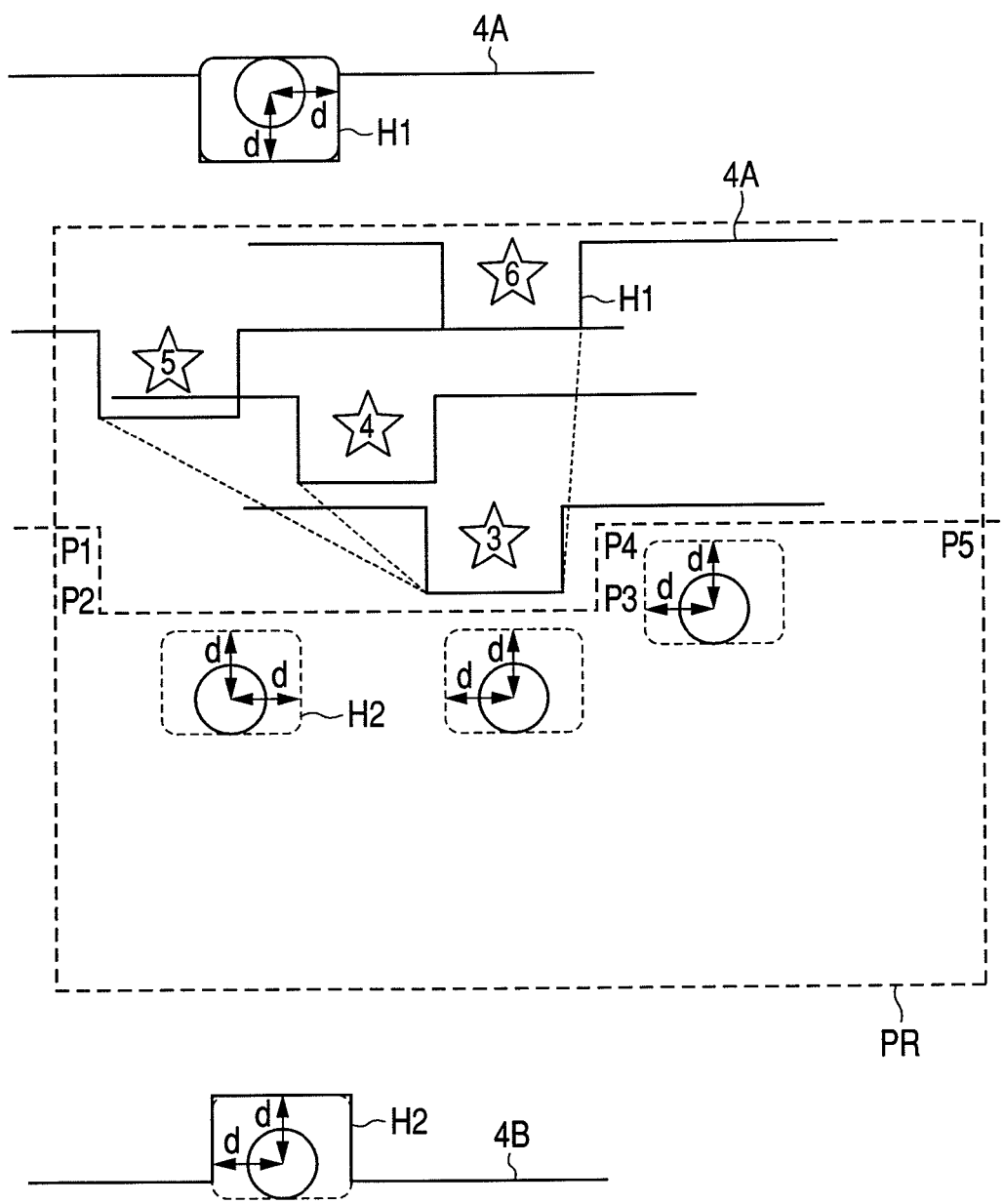
FIG. 10 is a view schematically showing the range which allows the second head to move when the first head is located at the position 3.

In FIG. 10, the first head H1 mounts the electronic component at the position 3 after finishing the mount operation of the electronic component at the position 2. The dotted line indicating the step function formed by connecting the P1, P2, P3, P4 and P5 denotes the range which allows the second head H2 to move. No collision occurs between the first head H1 and the second head H2 so far as the second head H2 moves within the defined range.

When the first head H1 finishes the mount operation of the electronic component at the position 3, the positions to which the first head is expected to move subsequently are the positions 4 to 6 in the order shown in the drawing. The position 5 locates to the leftmost positions of the position 3. Accordingly, the x-coordinate at the point P1 or P2 is defined by the position 5. Meanwhile, there is no position to which the first head H1 is expected to move subsequently to the right of the position 3. The second head H2 is moved to the point of the x-coordinate at the point P3 or P4.

Figure 11:
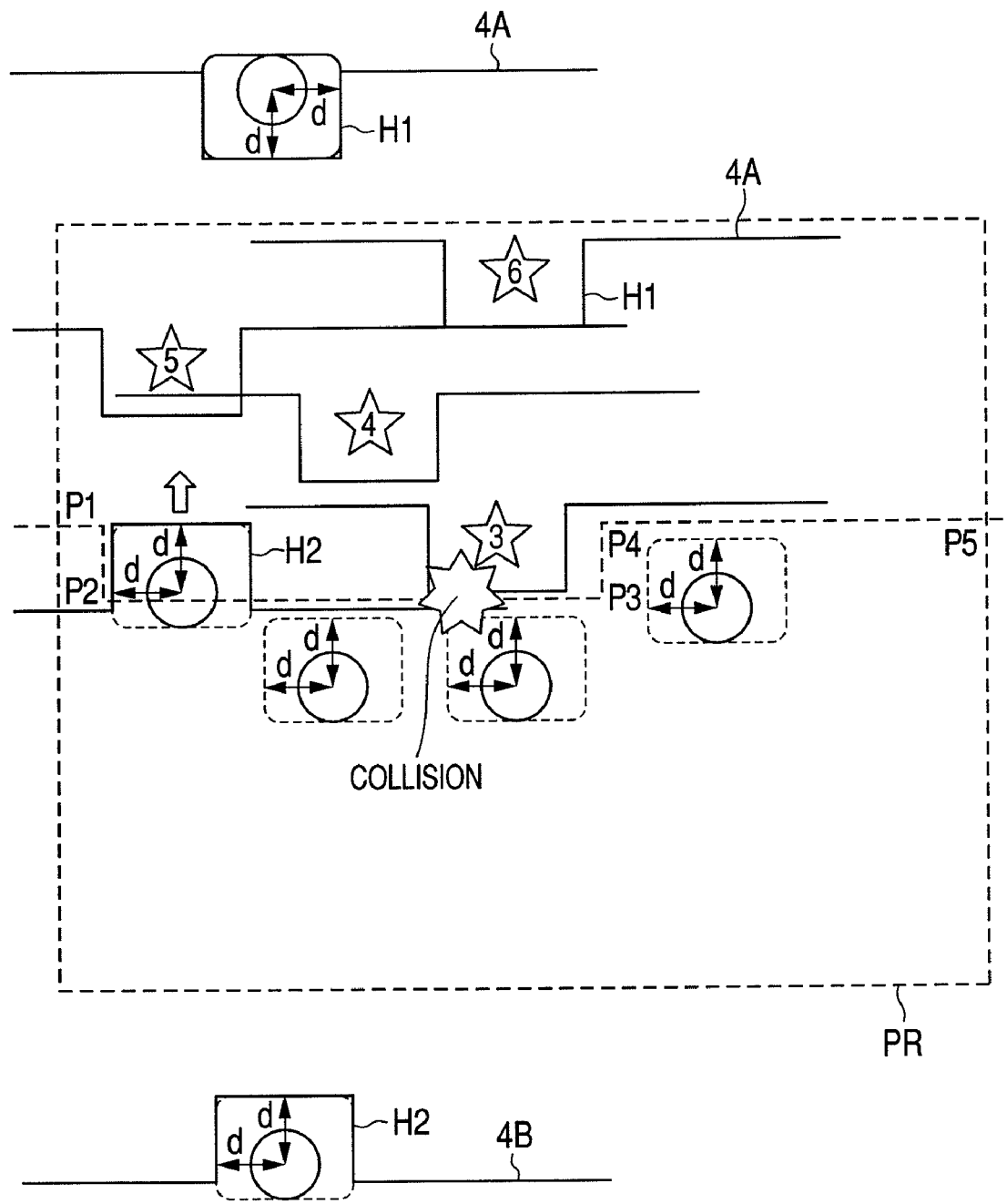
FIG. 11 is another view schematically showing the range which allows the second head to move when the first head is located at the position 3.

The y-coordinate at P1, P4 and P5 are defined for the purpose of avoiding the collision between the second head H2 and the first x-beam 4A with the first head H1, or between the first head H1 and the second x-beam 4B with the second head H2. Referring to FIG. 11, the first head H1 collides against the second x-beam 4B with the second head H2 when the second head H2 is about to move toward the position 5 of the first head H1 as indicated by the white arrow. Such collision may occur between the second head H2 and the first x-beam 4A with the first head H1. Accordingly, the range which allows the second head H2 to move is defined by the dotted line indicating the step function formed by connecting the P1, P2, P3, P4 and P5 shown in FIGS. 10 and 11.

Figure 12:
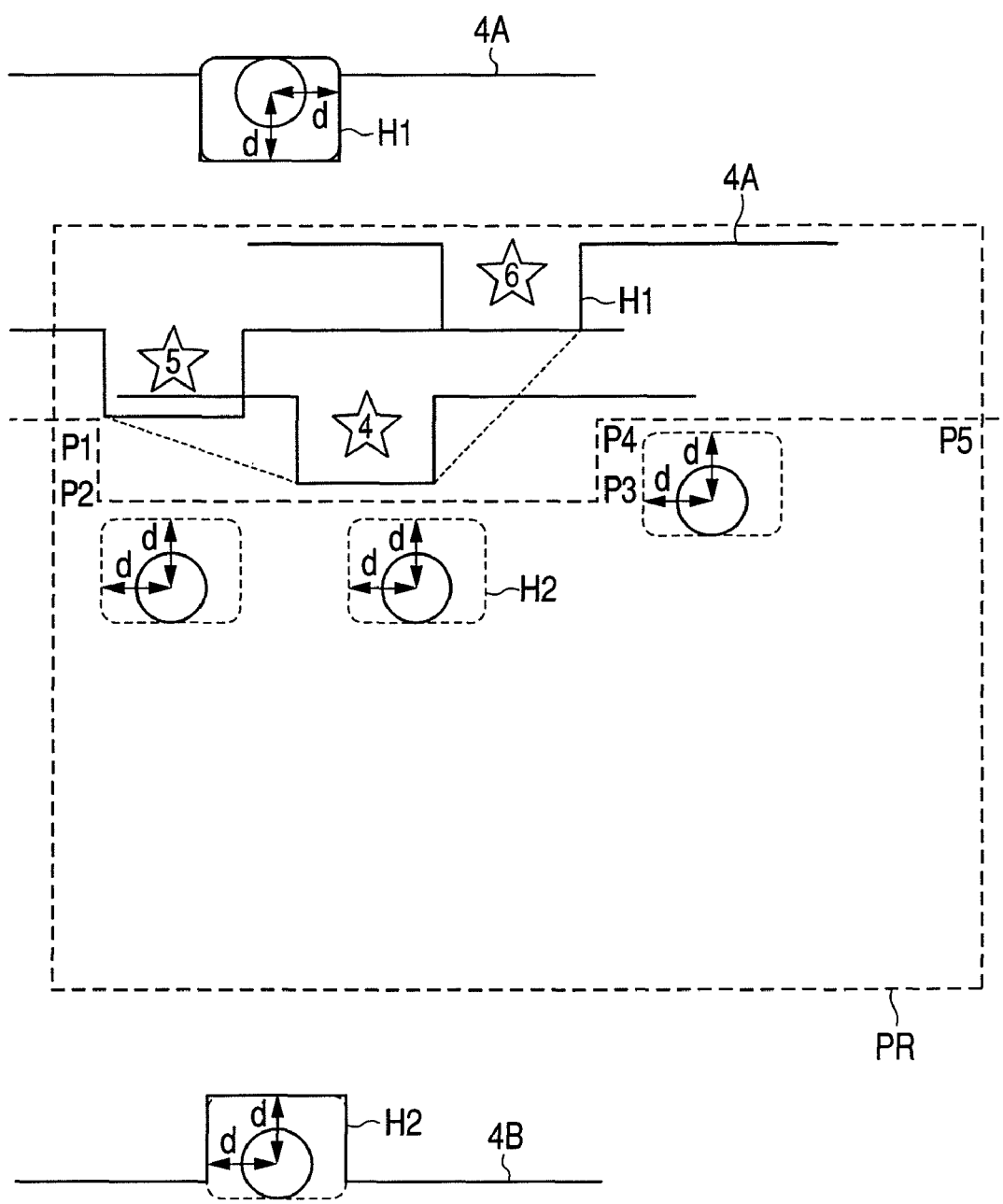
FIG. 12 is a view schematically showing the range which allows the second head to move when the first head is located at the position 4.

Referring to FIG. 12, the first head H1 mounts the electronic component at the position 4 after finishing the mount operation of the electronic component at the position 3. The dotted line indicating the step function formed by connecting the P1, P2, P3, P4 and P5 denotes the range which allows the second head H2 to move. No collision occurs between the first head H1 and the second head H2 so far as the second head H2 moves within the defined range.

When the first head H1 finishes the mount operation of the electronic component at the position 4, the positions to which the first head is expected to move subsequently are the positions 5 and 6 in the order shown in the drawing. The position 5 locates to the left of the position 4. Accordingly, the x-coordinate at the point P1 or P2 is defined by the position 5.

Meanwhile, the position 6 locates to the right of the position 4 of the first head H1. Accordingly, the x-coordinate at the point P3 or P4 is defined by the position 6. The y-coordinate at P1, P4 and P5 may be defined for the purpose of avoiding the collision between the second head H2 and the first x-beam 4A with the first head H1, or between the first head H1 and the second x-beam 4B with the second head H2.

Figure 13:
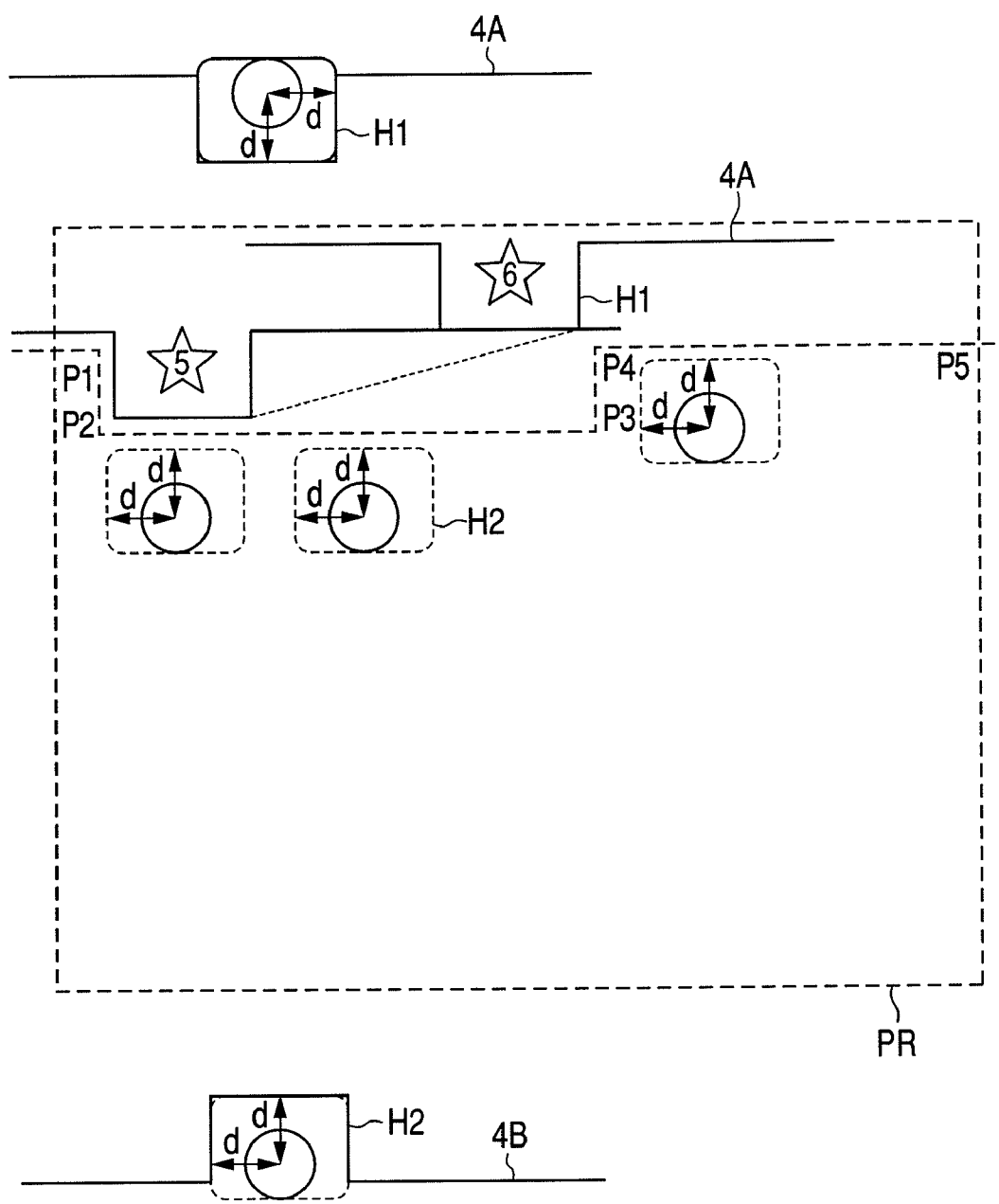
FIG. 13 is a view schematically showing the range which allows the second head to move when the first head is located at the position 5.

In FIG. 13, the first head H1 mounts the electronic component at the position 5 after finishing the mount operation of the electronic component at the position 4. The dotted line indicating the step function formed by connecting the points P1, P2, P3, P4 and P5 denotes the range which allows the second head H2 to move. No collision occurs between the first head H1 and the second head H2 so far as the second head H2 moves within the defined range.

When the first head H1 finishes the mount operation of the electronic component at the position 5, the position to which the first head is expected to move subsequently is only the position 6. There is no position to which the first head H1 moves subsequently to the left of the position 5 of the first head H1. Accordingly, the second head H2 is allowed to move to the x-coordinate at the point P1 or the point P2.

Meanwhile, referring to FIG. 13, the position 6 is located to the right of the position 5. Accordingly, the x-coordinate at the point P3 or the point P4 is defined by the position 6 of the first head H1. The y-coordinate at P1, P4 and P5 may be defined for the purpose of avoiding the collision between the second head H2 and the first x-beam 4A with the first head H1, or between the first head H1 and the second x-beam 4B with the second head H2.

Figure 14:
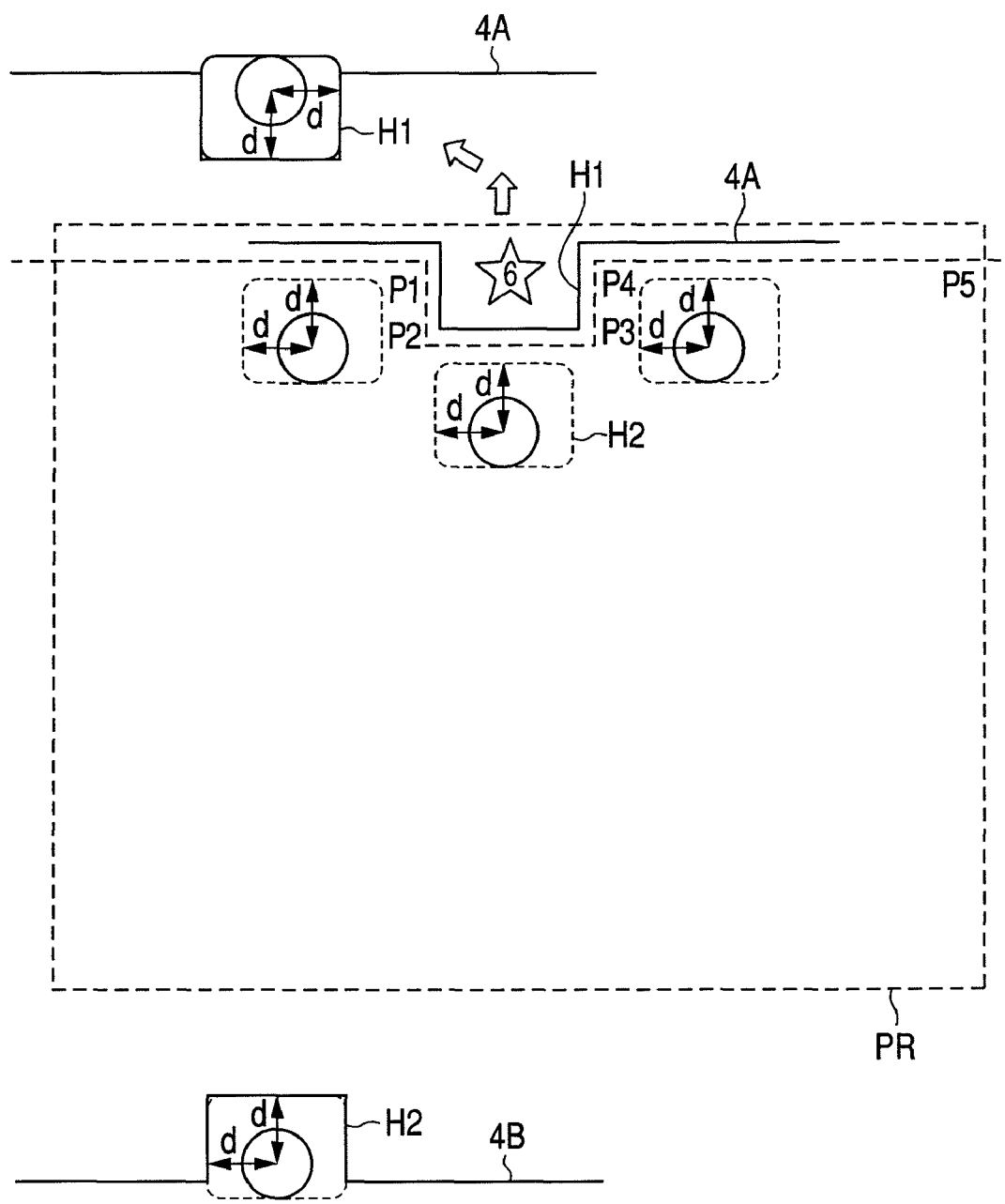
FIG. 14 is a view schematically showing the range which allows the second head to move when the first head is located at the position 6.

Referring to FIG. 14, the first head H1 mounts the electronic component at the position 6 after finishing the mounting operation of the electronic component at the position 5. The dotted line formed by connecting the P1, P2, P3, P4 and P5 indicates the range which allows the second head H2 to move. No collision occurs between the first head H1 and the second head H1 so far as the second head H2 moves within the defined range.

When the first head H1 finishes the mount operation of the electronic component at the position 6, the position to which the first head is expected to move subsequently is the home position or the feeder of the electronic component. That is, the first head H1 retracts backward as shown by the white arrow. Accordingly, the second head H2 is allowed to move to the region defined by the P1, P2, P3 and P4 shown in FIG. 14.

FIG. 15 shows an exemplary program for mounting the electronic components on the printed board PR by the first head H1 or the second head H2. Referring to FIG. 15, the code "No." denotes the order for mounting the electronic component by the first head H1 or the second head H2. For example, "No. 12" denotes the first head H1, and 12 operations designated by the Nos. 13 to 24 represent that the electronic components are mounted from 12 nozzles. "No. 25" denotes the second head H2, and 12 operations designated by the Nos. 26 to 37 represent that the electronic components are mounted from 12 nozzles. The operations Nos. 12 to 24 are sequentially performed by the first head H1, and operations Nos. 26 to 37 are sequentially performed by the second head H2. The first head H1 and the second head H2 are simultaneously operated.

Referring to FIG. 15, each of codes "U", "O" and "P" denotes the address of the memory which stores coordinate data for mounting the components. The memory address will be referred in the order of the mount operation. The beam shown in FIG. 15 denotes the first x-beam 4A or the second beam 4B.

Referring to FIG. 15, the "nozzle" denotes the number of the nozzle of the first head H1 or the second head H2. There are 12 nozzles for the respective heads. The code "Fdr No." denotes the position of the feeder for feeding the electronic components. That is, the first head H1 attracts the electronic component from the feeder No. 131, and the second head H2 attracts the component from the feeder No. 220, 230, 229, or 218. The code "Component ID" denotes the actual electronic component to be attracted by the nozzle.

In the aforementioned description, the first head H1 is structured to mount 12 electronic components at 6 positions on the printed board PR. The number of the mounting positions of the electronic components on the printed board is not limited to 6 but may be smaller or larger than 6. The number of the electronic components to be attracted by the first head H1 or the second head H2 at a time is set to 12. However, the number of the electronic components to be attracted by the respective heads may be changed by changing the attracting nozzle of the first head H1 or the second head H2. In the description, the first head H1 is preferentially operated. However, the second head H2 may be preferentially operated. In this case, the first head H1 and the second head H2 may be reversely operated.

In the present invention, the first head H1 is prioritized for mounting the electronic components, and the entry position of the second head H2 is determined in consideration with all the positions to which the first head H1 is expected to move subsequently. The entry position of the second head H2 is determined in consideration with the case where the electronic component held by the first head H1 is defective at the position to which the first head H1 is expected to move subsequently. Accordingly, no collision occurs between the first head H1 and the second head H2.

The second head H2 is allowed to move in the operating region of the head H1 except the one defined in consideration with the positions to which the first head H1 is expected to move subsequently. This makes it possible to extend the range which allows the second head H2 to move, and accordingly, the rate for mounting the electronic components may be accelerated to the decree corresponding to the extended range.

What is claimed is:

1. A mounting apparatus for electronic components comprising a conveying device for conveying a printed board in a first direction, and a first component supply device and a second component supply device at both outer sides of the conveying device in a second direction perpendicular to the first direction, wherein:
   a first y-beam and a second y-beam each extending in the second direction are provided apart from each other, and a first x-beam and a second x-beam each extending in the first direction are provided across the first and the second y-beams;
   the first x-beam is provided with a first mount head, and the second x-beam is provided with a second mount head;
   the first mount head takes out a plurality of electronic components from the first component supply device, and mounts the electronic components at a plurality of positions on the printed board, and the second mount head takes out a plurality of electronic components from the second component supply device, and mounts the electronic components at a plurality of positions on the printed board;
   a movement of the first mount head is prioritized to a movement of the second mount head; and
   the movement of the second mount head is determined in consideration with each mount position on the printed board from the mount position where the electronic component is mounted by the first mount head on the printed board until the end of mount operations of all the electronic components held by the first mount head.

2. The mounting apparatus for electronic components according to claim 1, wherein when an extending direction of the x-beam is set as an x-direction, and an extending direction of the y-beam is set as a y-direction, a range which allows the second mount head to move changes step functionally from the position at which the second mount head opposes the first mount head in the y-direction to the position at which the second mount head overlaps with the first mount head in the y-direction.

3. The mounting apparatus for electronic components according to claim 2, wherein the position which step functionally changes from the position at which the second mount head opposes the first mount head in the y-direction to the position at which the second mount head overlaps with the first mount head in the y-direction is determined by a maximum x-coordinate and a minimum x-coordinate at each mount position on the printed board from the position at which the mount operation is currently performed by the first mount head until the end of the mount operations of all the electronic components held by the first mount head on the printed board.

4. The mounting apparatus for electronic components according to claim 2, wherein a step of the step function in the y-direction defines a range where no collision occurs between the first x-beam and the second mount head, and a range where no collision occurs between the second x-beam and the first mount head.

5. A mounting apparatus for electronic components comprising a conveying device for conveying a printed board in a first direction, and a first component supply device and a second component supply device at both outer sides of the conveying device in a second direction perpendicular to the first direction, wherein:
   a first y-beam and a second y-beam each extending in the second direction are provided apart from each other, and a first x-beam and a second x-beam each extending in the first direction are provided across the first and the second y-beams;
   the first x-beam is provided with a first mount head, and the second x-beam is provided with a second mount head;
   the first mount head takes out a plurality of electronic components from the first component supply device, and mounts the electronic components at a plurality of positions on the printed board, and the second mount head takes out a plurality of electronic components from the second component supply device, and mounts the electronic components at a plurality of positions on the printed board;
   a movement of the first mount head is prioritized to a movement of the second mount head; and
   a region which allows the second mount head to move includes a first boundary opposite the first mount head which currently mounts the electronic component on the printed board in the y-direction and a second boundary which overlaps with the first mount head in the y-direction, both of which change step functionally.

6. The mounting apparatus for electronic components according to claim 5, wherein the coordinate in the x-direction having the step function changing stepwise is defined by a maximum x-coordinate and a minimum x-coordinate at each mount position on the printed board from the position at which the mount operation is currently performed by the first mount head until the end of the mount operations of all the electronic components held by the first mount head on the printed board.

7. The mounting apparatus for electronic components according to claim 5, wherein a step of the step function in the y-direction defines a range where no collision occurs between the first x-beam and the second mount head, and a range where no collision occurs between the second x-beam and the first mount head.

8. A mounting apparatus for electronic components comprising a conveying device for conveying a printed board in a first direction, and a first component supply device and a second component supply device at both outer sides of the conveying device in a second direction perpendicular to the first direction, wherein:

a first y-beam and a second y-beam each extending in the second direction are provided apart from each other, a first x-beam extends from the first y-beam in the first direction, and a second x-beam extends from the second y-beam in a reverse direction of the first direction;

the first x-beam is provided with a first mount head, and the second x-beam is provided with a second mount head;

the first mount head takes out a plurality of electronic components from the first component supply device, and mounts the electronic components at a plurality of positions on the printed board, and the second mount head takes out a plurality of electronic components from the second component supply device, and mounts the electronic components at a plurality of positions on the printed board;

a movement of the first mount head is prioritized to a movement of the second mount head; and the movement of the second mount head is determined in consideration with each mount position on the printed board from the mount position where the electronic component is mounted by the first mount head on the printed board until the end of mount operations of all the electronic components held by the first mount head.

9. A mounting apparatus for electronic components comprising a conveying device for conveying a printed board in a first direction, and a first component supply device and a second component supply device at both outer sides of the conveying device in a second direction perpendicular to the first direction, wherein:

a first y-beam and a second y-beam each extending in the second direction are arranged apart from each other, a first x-beam extends from the first y-beam in the first direction, and a second x-beam extends from the second y-beam in a reverse direction of the first direction;

the first x-beam is provided with a first mount head, and the second x-beam is provided with a second mount head;

the first mount head takes out a plurality of electronic components from the first component supply device, and mounts the electronic components at a plurality of positions on the printed board, and the second mount head takes out a plurality of electronic components from the second component supply device, and mounts the electronic components at a plurality of positions on the printed board;

a movement of the first mount head is prioritized to a movement of the second mount head; and a region which allows the second mount head to move includes a first boundary opposite the first mount head which currently mounts the electronic component on the printed board in the y-direction and a second boundary which overlaps with the first mount head in the y-direction, both of which change step functionally.

* * * * *